(12) United States Patent
Miyajima et al.

(10) Patent No.: US 6,796,763 B2
(45) Date of Patent: Sep. 28, 2004

(54) CLEAN BOX, CLEAN TRANSFER METHOD AND SYSTEM

(75) Inventors: Toshihiko Miyajima, Tokyo (JP); Tsutomu Okabe, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/600,334

(22) Filed: Jun. 23, 2003

(65) Prior Publication Data

US 2004/0035493 A1 Feb. 26, 2004

Related U.S. Application Data

(62) Division of application No. 09/473,946, filed on Dec. 29, 1999, now Pat. No. 6,641,349.

(30) Foreign Application Priority Data

Apr. 30, 1999 (JP) .......................................... 11-124166
Apr. 30, 1999 (JP) .......................................... 11-124167

(51) Int. Cl.$^7$ .............................................. B65G 49/07
(52) U.S. Cl. ................................... 414/805; 414/217.1
(58) Field of Search ............................ 414/217, 217.1, 414/292, 411, 805, 939, 940; 220/231, 239, 240; 206/711

(56) References Cited

U.S. PATENT DOCUMENTS 3,694,962 A * 10/1972 McDonald et al. ........ 49/477.1
4,724,874 A * 2/1988 Parikh et al. .................. 141/98
5,139,459 A * 8/1992 Takahashi et al. ........... 454/187
5,295,522 A * 3/1994 DeAngelis et al. ............ 141/98
5,364,219 A * 11/1994 Takahashi et al. ........... 414/217
5,433,574 A * 7/1995 Kawano et al. .............. 414/217
5,482,161 A * 1/1996 Williams et al. ............. 206/711
5,575,081 A * 11/1996 Ludwig ......................... 34/218
5,628,683 A * 5/1997 Gentischer ................... 454/187
5,638,971 A * 6/1997 Justesen ...................... 215/228
5,740,845 A * 4/1998 Bonora et al. ............... 141/292
5,806,574 A * 9/1998 Yamashita et al. ............. 141/63
5,810,062 A * 9/1998 Bonora et al. ............... 141/351
5,879,458 A * 3/1999 Roberson, Jr. et al. ...... 118/715
6,164,664 A * 12/2000 Fosnight et al. ............. 277/635
6,168,364 B1   1/2001 Miyajima
6,170,690 B1 * 1/2001 Hosoi .......................... 220/238
6,199,604 B1   3/2001 Miyajima
6,302,927 B1 * 10/2001 Tanigawa ................... 29/25.01
6,338,604 B1 * 1/2002 Okabe et al. .............. 414/217.1
6,390,145 B1   5/2002 Okabe et al.
6,430,802 B1   8/2002 Miyajima
6,561,894 B1   5/2003 Miyajima

* cited by examiner

Primary Examiner—James W. Keenan
(74) Attorney, Agent, or Firm—Oblon, Spivak, McClelland, Maier & Neustadt, P.C.

(57) ABSTRACT

A clean box is composed of a box body having an opening in one surface thereof and a lid member for closing the opening. An annular groove is formed so as to surround the opening on one of the box body or the lid member for defining a suction space sealed between the lid member and the box body under the condition that the lid member is mounted on the box body. Furthermore, intake/exhaust ports are provided for vacuum exhaust/release from the outside.

10 Claims, 11 Drawing Sheets

CLEAN BOX, CLEAN TRANSFER METHOD AND SYSTEM

This application is a Div. of Ser. No. 09/473,946 dated Dec. 29, 1999 now U.S. Pat. No. 6,641,349.

BACKGROUND OF THE INVENTION

1. Field of the Invention

The present invention relates to transfer, under a clean environment, of various articles to be processed such as a semiconductor wafer in a manufacturing process of a semiconductor, an electronic part related product, an optical disk or the like, and more particularly to a clean box that makes it possible to transfer the articles among various processing devices in a clean condition without any contaminated substance, a clean transfer method and a clean transfer system using such a clean box.

2. Related Background Art

Recently, in a manufacturing process that needs a high level clean environment such as a semiconductor device manufacturing process, a method such as a mini-environment or a local clean space for keeping only the peripheral environment of a product under a clean condition without making the entire factory into a clean room state has been employed. Simply stating, this means that only an interior of each processing device in the manufacturing process is kept under a clean environment, and the transfer and the deposit of the articles to be processed is performed among the respective processing devices (clean devices) by using containers whose interior is kept clean (which will be referred to as clean boxes).

An example of such a local clean space system in the semiconductor manufacturing process will now be described with reference to FIG. 1 that illustrates an embodiment of the present invention. FIG. 1 shows a condition that a clean box 40 is mounted on a semiconductor wafer processing apparatus 10 as the local clean space (i.e., clean device).

The semiconductor wafer processing apparatus 10 is composed of an apparatus body 30 and a load port 20 for loading into the apparatus from the outside of the apparatus a semiconductor wafer that is an article to be processed by the apparatus body 30. FIG. 1 shows the apparatus body 30 on the left side and the load port on the right side of a straight line A. These load port 20 and the apparatus body 30 make the local clean space within the semiconductor wafer processing apparatus 10 together.

In such a local clean space system, in order to transfer the semiconductor wafer while keeping the clean condition among different processing devices, the clean box as a container whose interior is kept clean is used. FIG. 1 shows a condition that the bottom open type clean box 40 is mounted on the load port 20. The clean box 40 is composed of a box body 41 and a lid 42. The lid 42 is removed downwardly and the wafer in the interior is taken out to be loaded on the processing device under the condition that the clean box 40 is laid on the load port 20.

In the conventional clean box, the fixture of the lid to the box body has been carried out by a mechanical lock mechanism. For instance, a lock mechanism provided on the lid member and composed of a movable claw made of metal and a rotary cam member for moving the movable claw between a lock position where the movable claw projects by a predetermined amount from the outer periphery of the lid and a release position where the movable claw is retracted from the outer periphery of the of the lid, is used. In the case where the lid is to be fixed to the box body, the rotary cam member is rotated to thereby bring the movable claw to the lock position and the movable claw is engaged with a hole formed in the box body in this position so that the lid is locked to the box body. Such a lock mechanism of the clean box is operated by causing the above-described cam member to rotate by an opening/closing device provided in the load port under the condition that the clean box is mounted on the load port, to thereby perform the locking/releasing operation of the lid to/from the box body.

In order to keep the interior of the clean box clean, it is necessary to keep a sealed condition against the outside. Accordingly, a sealing means such as an O-ring for sealing the interface between the lid and the box body is provided. However, the above-described mechanical lock mechanism that has been used in the conventional clean box may impart a pressure of only several N's (Newton) at the largest so that the O-ring is not sufficiently deformed. For this reason, it is impossible to prevent dust or any other organic or inorganic substance from entering the interior, and it is impossible to maintain the clean space.

Also, in order to prevent the natural oxidation of the semiconductor wafer during the process waiting period, the interior air within the clean box is replaced with non-oxidizing gas such as nitrogen N2 and inert gas, in some cases. However, the sealing force is small in the conventional mechanical lid lock mechanism, and therefore it is impossible to maintain the replacement condition of the non-oxidizing gas.

SUMMARY OF THE INVENTION

An object of the present invention is to provide a bottom removal type clean box that is high in sealing property in comparison with a mechanical lock mechanism, and a transfer method and system using such a clean box.

In order to attain the above-mentioned object, a clean box according to a first aspect of the present invention has a structure comprising: a box body having an opening in a bottom; a lid member for closing the opening; an annular groove formed so as to surround the opening on at least one of the box body and the lid member to define a suction space sealed between the lid member and the box body under the condition that the lid member is mounted on the box body; and an intake/exhaust port for allowing vacuum exhaust/release of the annular groove from the outside.

The above-described annular groove may be formed on either box body side or lid member side or on both sides. In any case, in order to apply the present invention to a practical case, it is preferable that the periphery of the opening of the box body is in the form of a flanged shape and the annular groove is formed on the flange or on a portion of the lid member confronting the flange of the box body. In order to effect sealing, a sealing member such as an O-ring is provided along the groove. The clean box according to another aspect of the present invention to be described later also has the same structure with respect to the annular groove.

In this clean box, provision of the mechanical latch for preventing the lid member from falling apart from the box body is preferable, since even if the vacuum suction is damaged due to some reason during the transfer of the box, there is no fear that the lid member falls down. It is preferable that the mechanical latch has a mechanism for opening/closing the latch from the outside.

Also, as described above, if the semiconductor wafer is exposed in the air, an oxide film is naturally grown. This is undesirable. In order to prevent this, the gas within the clean box is replaced with the non-oxidizing gas such as nitrogen or inert gas. In accordance with this, a valve may be provided in the clean box according to the present invention for allowing the gas to be discharged or introduced for the replacement of the gas within the interior of the clean box.

It is preferable that the valve for replacement of gas in the interior of the clean box is composed of a gas input valve having a valve body for introducing the non-oxidizing gas into the interior of the clean box and a gas output valve having a valve body for discharging the gas in the clean box to the outside.

In a preferred mode of the clean box according to the present invention, an annular groove intake/exhaust port and the valves for gas replacement (gas input valve and gas output valve) are provided on the same single side surface of the clean box body. Thus, since the access directions for the vacuum discharge of the above-described annular groove and the various arrangements for replacement of the gas in the clean box, provided on the load port of a clean device such as a semiconductor wafer processing apparatus which receives clean box become the same, it is possible to simplify the structure of the load port. For example, the above-described various arrangements may be formed as a single unit that allows the unit to access to the clean box by one operation.

A clean transfer system in which a clean box according to the first aspect of the present invention is employed, is structured as described below. That is, a clean transfer system comprising:

a clean box comprising: a box body having an opening in a bottom; a lid member for closing the opening; an annular groove formed so as to surround the opening on at least one of the box body and the lid member to define a suction space sealed between the lid member and the box body under the condition that the lid member is mounted on the box body; and an intake/exhaust port for allowing vacuum exhaust/release of the annular groove from the outside, and a load port of a clean device whose interior is kept under a clean environment and having a box lid opening/closing mechanism for opening/closing the lid member of the clean box, wherein the clean box is disposed with the lid member facing downward so that the lid member and the box lid opening/closing mechanism on the load port are aligned to confront with each other, and the load port has a means for vacuum discharging/vacuum releasing the suction space through the intake/exhaust port of the clean box.

In a preferred mode of the clean transfer system, a valve for allowing the gas replacement in the interior of the clean box is provided in the above-described clean box.

It is preferable that the valve for replacement of gas in the interior of the clean box is composed of a gas input valve having a valve body for introducing the non-oxidizing gas into the interior of the clean box and a gas output valve having a valve body for discharging the gas in the clean box to the outside. In this case, arrangements for gas replacement in cooperation with these valves, i.e., a gas feed device in cooperation with the gas input valve and a gas discharge device in cooperation with the gas output valve are provided on the load port.

In this case, it is preferable that an annular groove intake/exhaust ports and valves for gas replacement (gas input valve and gas output valve) be provided on the same single side surface of the clean box body, and means for vacuum exhaust/release of the above-described annular groove or various arrangements for gas replacement in the clean box in cooperation with the valves are constituted into a single unit so that the clean box may be accessed by one operation.

A clean box according to a second aspect of the present invention has a structure comprising: a box body having an opening in one surface thereof; a lid member for closing the opening; an annular groove formed so as to surround the opening on at least one of the box body and the lid member to define a suction space sealed between the lid member and the box body under the condition that the lid member is mounted on the box body; and an intake/exhaust port for allowing vacuum exhaust/release of the annular groove from the outside, formed on the lid member.

Thus, the annular groove is provided between the box body and the lid member to define the suction space to thereby vacuum discharge the annular groove so that the lid member is strongly absorbed to the box body by the pressure difference between the annular groove and the outside. Thus, it is possible to air-tightly seal the interface between the lid member and the box body with a uniform and strong force in comparison with the mechanical lock mechanism. In addition, since the annular groove intake/exhaust port for vacuum exhaust/release is provided on the lid member side, upon setting the clean box on the load port of the clean device such as a semiconductor processing apparatus, it is sufficient that the alignment between the clean box and the load port is performed only on the surface on the lid side.

In this clean box, the vacuum suction between the lid member and the box body is realized by exhausting from the outside the air in the suction space of the annular groove thus produced. It is possible to constitute the intake/exhaust port for vacuum exhaust/release of the annular groove from the outside as a passage passing through the lid member to open to the outside (on the surface of the lid member confronting the outside) and a valve mechanism for opening/closing the passage. A mechanism for opening/closing the valve is provided on the load port side.

Also, according to this second aspect of the invention, in the same manner as in the above-described first aspect of the invention, the valves for allowing the replacement of the gas within the clean box may be provided. It is preferable that these valves be provided on the lid member.

It is preferable that these valves be composed of a gas input valve comprising a valve for introducing the non-oxidizing gas into the interior of the clean box and a gas output valve comprising a valve for discharging the gas in the clean box to the outside.

The valve is also provided on the lid member. So, if only the alignment between the lid side of the clean box and the load port is performed, the alignment between the valve and the gas replacement device that works in corporation with the valve on the side of the load port is also attained. In this case, a mechanism performing the introduction/discharge of the gas from/to the interior of the box may be provided integrally with the box lid opening/closing mechanism.

In the case where the clean transfer system is constituted by using the clean box in accordance with the second aspect of this invention, it is possible for all the various mechanisms of the load port to access the clean box from one direction (i.e., from the side of the lid member). In this case, the lid opening/closing mechanism (including the mechanism for performing the vacuum exhaust/release of the annular groove) of the clean box and the mechanism for gas replacement of the clean box (if the clean box has the gas replacement valves) are both provided in the one single elevator mechanism to thereby simplify the structure. Also, in the clean transfer system using this clean box, it is preferable that a means for performing the alignment between the lid member of the clean box and the load port be provided. It is possible to constitute this alignment means as, for example, a combination of a plurality of positioning pins provided on the load port and the holes engaged with the pins on the lid member of the clean box.

A clean transfer method according to the present invention uses the clean box according to the present invention. That is, the clean box comprises: a box body having an opening in a bottom; a lid member for closing the opening; an annular groove formed so as to surround the opening on at least one of the box body and the lid member to define a suction space sealed between the lid member and the box body under the condition that the lid member is mounted on the box body; and an intake/exhaust port for performing vacuum exhaust/release of the annular groove from the outside, and the clean transfer method comprises the steps of:

setting the clean box, sucked by vacuum exhausting the annular groove, on a load port of a clean device whose interior is kept under a clean environment and having a box lid opening/closing mechanism for opening/closing the lid member of the clean box, so that the lid member and the box lid opening/closing mechanism on the load port are aligned to confront with each other with the lid member facing downwardly;

releasing vacuum in the suction space through the intake/exhaust port by a mechanism for releasing the vacuum provided in the load port to thereby open the lid member; and picking up an article to be transferred within the clean box and moving the article to the clean device.

Also, after the article to be transferred that has been subjected to the process in the clean device is returned to the interior of the clean box, the lid member of the clean box is closed by the above-described box lid opening/closing mechanism. Then, the above-described suction space is evacuated through the above-described intake/exhaust mechanism by the vacuum exhaust mechanism provided in the load port so that the lid member and the box body are sucked to each other. It is preferable that the mechanism for releasing the vacuum and the vacuum exhaust mechanism are formed into one unit.

In the clean transfer method according to the present invention, in the case where the clean box has the mechanical latch, the box lid opening/closing mechanism releases the mechanical latch before the release of the vacuum in the suction space. Also, after the article to be transferred that has been subjected to the process in the clean device is returned to the interior of the clean box, the above-described suction space is evacuated to suck the lid member and the box body together. Thereafter, the mechanical latch is effected.

In the above-described clean transfer method, in the case where the clean box has the valve allowing the gas replacement in the interior of the clean box and the gas in the clean box is replaced with the non-oxidizing gas, the article to be transferred that has been subjected to the process in the clean device is returned to the interior of the clean box, the lid member of the clean box is closed, and the above-described suction space is exhausted to thereby suck the lid member and the box body together. Thereafter, the replacement of the gas in the interior of the clean box is carried out through the valve.

A clean transfer method according to another aspect of the present invention is characterized in that: the clean transfer method uses a clean box comprising: a box body having an opening in a bottom; a lid member for closing the opening; an annular groove formed so as to surround the opening on at least one of the box body and the lid member to define a suction space sealed between the lid member and the box body under the condition that the lid member is mounted on the box body; and an intake/exhaust port for performing vacuum exhaust/release of the annular groove from the outside, formed on the lid member, and that: the clean transfer method comprises the steps of:

setting the clean box, sucked by vacuum exhausting the annular groove, on a load port of a clean device whose interior is kept under a clean environment and having a box lid opening/closing mechanism for opening/closing the lid member of the clean box, so that the lid member and the box lid opening/closing mechanism on the load port are aligned to confront with each other;

releasing vacuum in the suction space by a box lid opening/closing mechanism of the load port through the intake/exhaust port provided on the lid member of the clean box to thereby open the lid member; and picking up an article to be transferred within the clean box and moving the article to the clean device.

Also, in this clean transfer method; the article to be transferred that has been subjected to the process in the clean device is returned to the interior of the clean box, the above-described box lid opening/closing mechanism closes the lid member of the clean box, and the above-described suction space is exhausted or evacuated through the above-described intake/exhaust mechanism to thereby suck the lid member and the box body together.

In the case where the clean box has the mechanical latch, the box lid opening/closing mechanism releases the mechanical latch before the release of the vacuum in the suction space. Also, after the article to be transferred that has been subjected to the process in the clean device is returned to the interior of the clean box, the above-described suction space is evacuated to suck the lid member and the box body together. Thereafter, the mechanical latch is effected.

Also, in this clean transfer method, in the case where the clean box has the valve that allows the gas replacement in the interior of the clean box and the gas in the clean box is replaced with the non-oxidizing gas, the article to be transferred that has been subjected to the process in the clean device is returned to the interior of the clean box, the lid member of the clean box is closed, and the above-described suction space is discharged through the above-described intake/exhaust mechanism to thereby suck the lid member and the box body together. Thereafter, the gas in the interior of the clean box is replaced through the valve.

BRIEF DESCRIPTION OF THE DRAWINGS

In FIGS. 1 to 6 showing a semiconductor processing apparatus according to a first embodiment of a clean system using a clean box according to the present invention, FIG. 1 is a view schematically showing the entire semiconductor processing apparatus;

FIG. 3 is a top view of the clean box;

FIG. 4 is a side elevational view showing each port of the clean box and various related mechanisms on the gas unit side;

FIG. 5 is a bottom view showing a latch mechanism of a lid of the clean box;

FIG. 6 is a side elevational view showing a latch opening/closing mechanism of the load port.

FIG. 7 is a view schematically showing the entire semiconductor processing apparatus;

FIG. 8 is a side elevational view showing a clean box of FIG. 7 in detail;

FIG. 9 is a views showing a bottom surface of the clean box;

FIG. 10 is a side elevational view showing, partly in cross section, a vacuum port of a lid of the clean box and a related vacuum mechanism;

FIG. 11 is a perspective view taken along the line 11—11 of FIG. 10;

FIG. 12 is a side elevational view showing, in part in cross section, a gas input port of the lid of the clean box and a related gas feed mechanism;

FIG. 13 is a bottom view showing a latch mechanism of the lid of the clean box; and FIG. 14 is a side elevational view showing a latch opening/closing mechanism of the load port.

DESCRIPTION OF THE PREFERRED EMBODIMENTS

An embodiment of the present invention will now be described with reference to the accompanying drawings.

Figure 1:
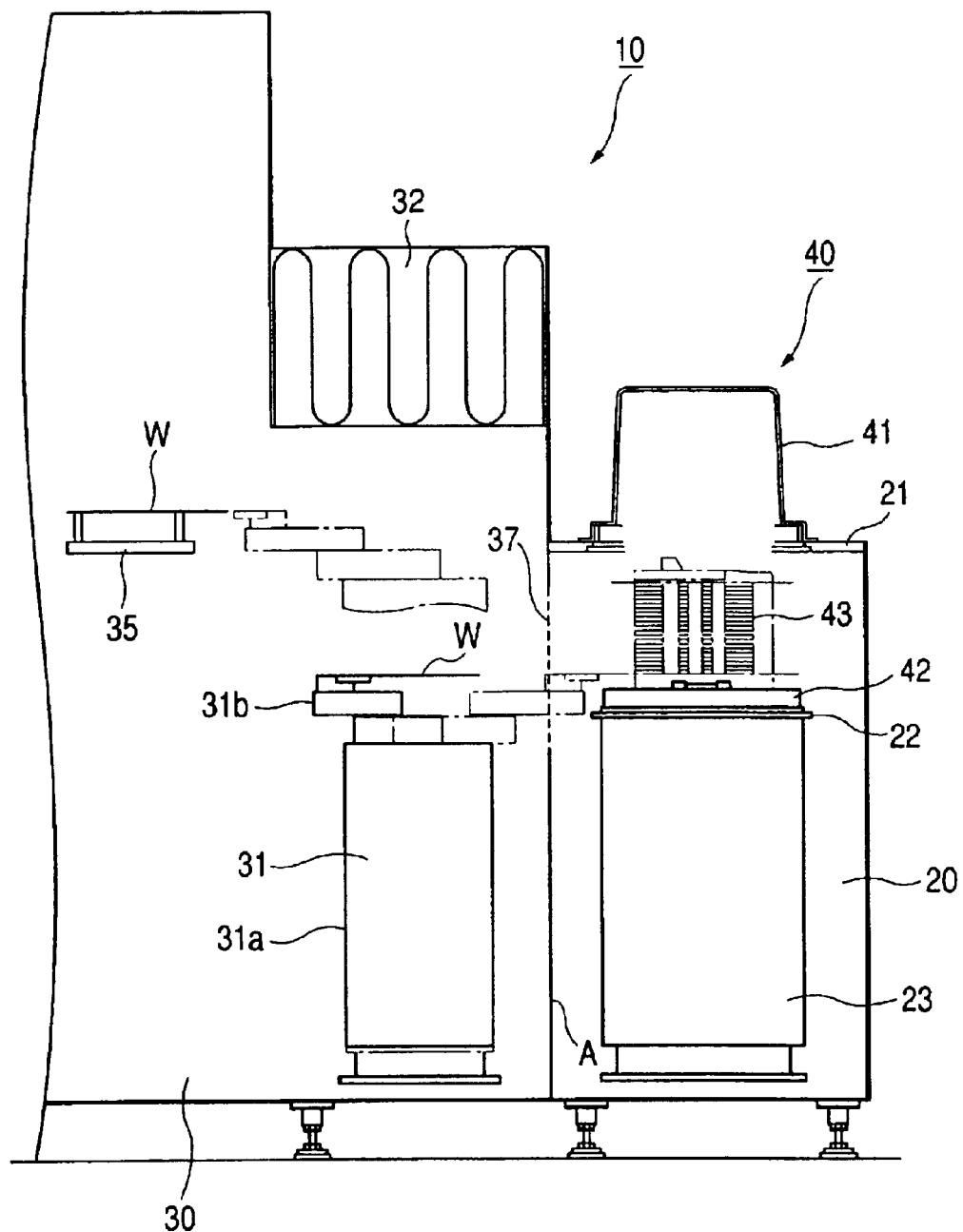

FIG. 1 schematically shows a local clean space system of a semiconductor manufacture apparatus including a clean box according to a first embodiment of the present invention.

In FIG. 1, the semiconductor wafer processing apparatus 10 is composed of an apparatus body 30 and a load port 20 for loading a semiconductor wafer within a clean box 40 into the processing device. An interface between the apparatus body 30 and the load port 20 is designated by a line A in FIG. 1. Usually, the load port 20 is formed as a discrete device that is detachably mounted on the apparatus body 30. However, the load port may be formed integrally with the apparatus body. The apparatus body 30 is in communication with the load port through an opening 37 formed at a portion indicated by a dotted line on the line A of FIG. 1 for sending and receiving the semiconductor wafer between the load port and the apparatus body through the opening 37.

The space within the apparatus body 30 and the space of the load port 20 are in communication with each other through the above-described opening 37 so that the overall interior including both constitutes the local clean space. In order to keep the space clean, a fan intake blower device 32 having a filter is provided at an upper portion of the semiconductor wafer processing apparatus 10. A downstream air flow is generated within the apparatus by the fan intake blower device 32 to thereby keep the space within the semiconductor wafer processing apparatus 10 clean. The downstream air flow is discharged from the bottom of the apparatus to the outside.

In FIG. 1, the clean box 40 in accordance with the present invention is set on a table 21 of a top surface of the load port 20. The clean box 40 is a sealed type container composed of a box-shaped clean box body 41 that opens at its bottom and a lid 42 for covering the opening of the bottom of the body. As will be described in more detail later, when the clean box 40 is laid on the table 21 of the load port 20 and the wafer W within the clean box 40 is entered and removed, the interface between the clean box body 41 and the table 21 is sealed by a vacuum suction using the annular groove formed in the table 21 to thereby maintain the clean space against the outside.

The clean box 40 is a container to be used for transfer of wafer among different devices and temporary deposit of the wafer. The clean box 40 has a carrier 43 fixed to the lid 42. The carrier 43 is a rack type structure for receiving a plurality of wafers in parallel and at an equal interval.

The clean box 40 is transferred by a transfer means such as an overhead transfer (OHT) system within the factory and is set on the table 21 of the load port 20. In some case, the transfer of the clean box may be manually performed directly by the operator.

Figure 2A:
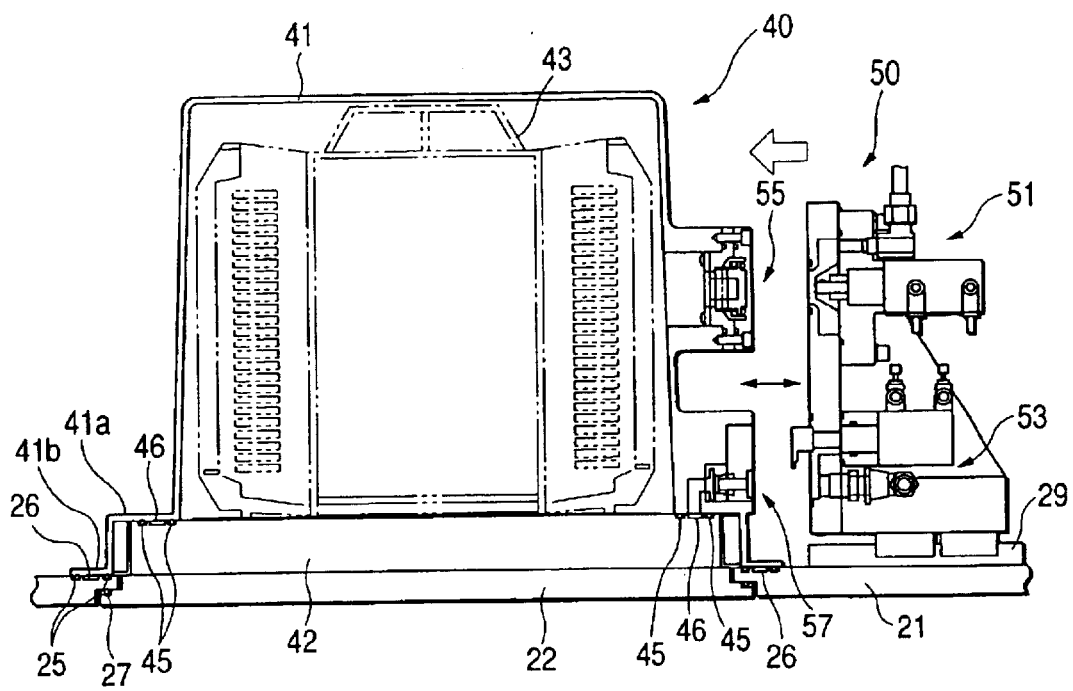
FIG. 2A is a side elevational view showing a load port table on which the clean box is laid.
Figure 2B:
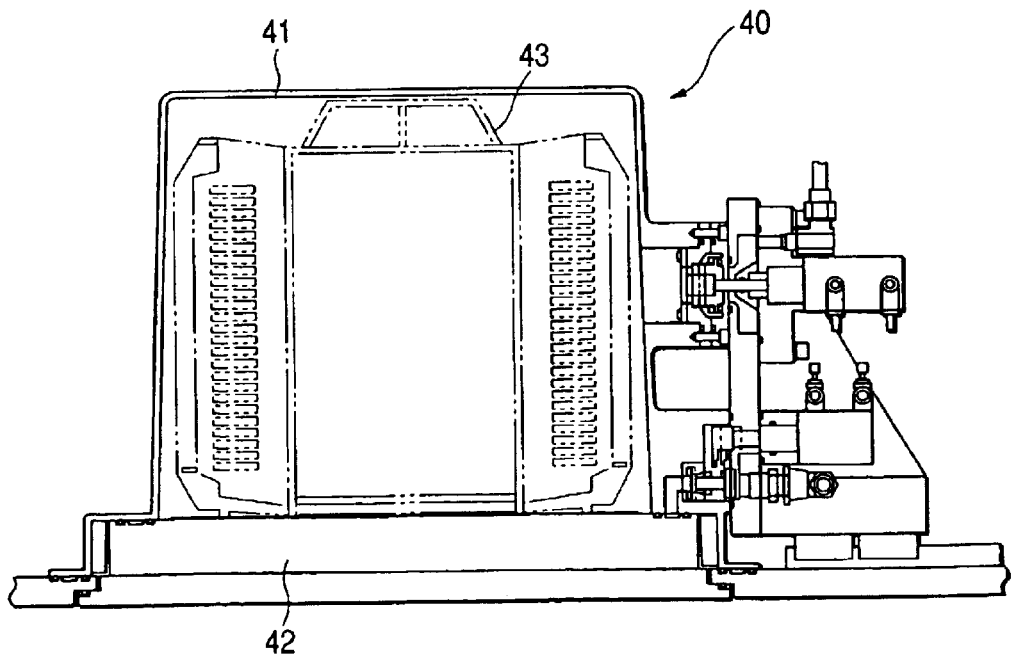
FIG. 2B is a side elevational view that is similar to FIG. 2A, showing a condition that a gas unit is in operative position in contact with the clean box
Figure 3:
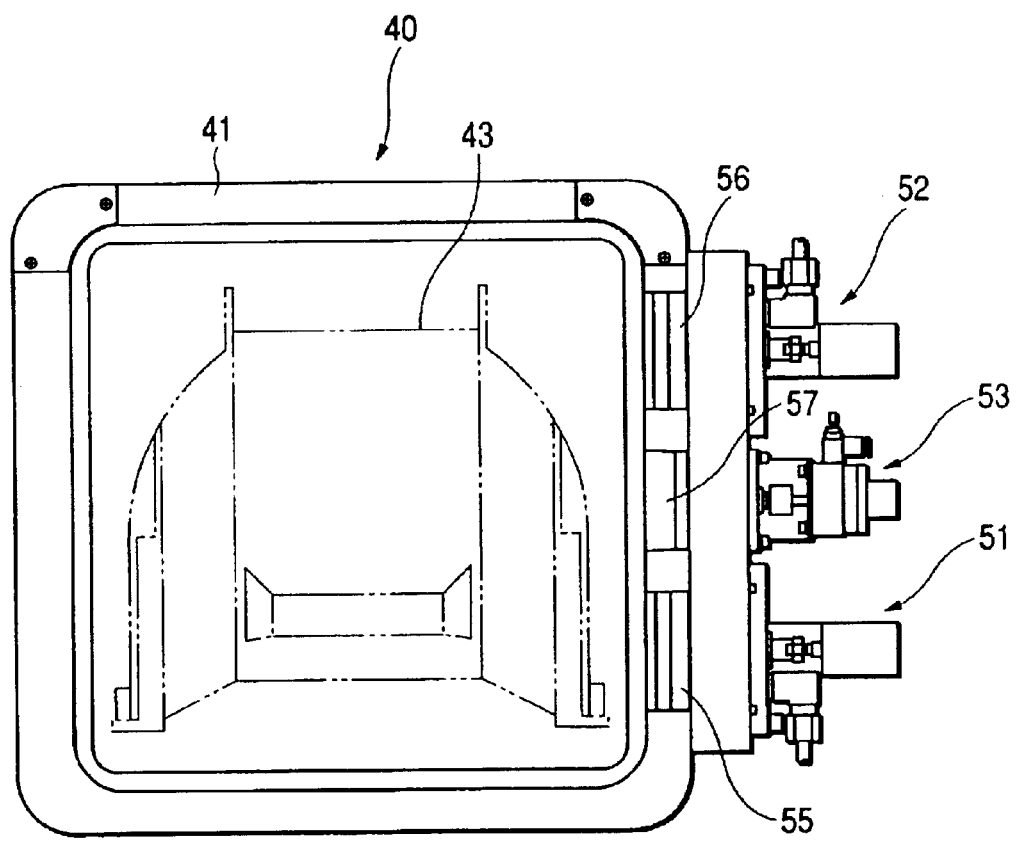

The clean box 40 will now be described in more detail with reference to FIGS. 2A and 2B and FIG. 3. FIGS. 2A and 2B are both side elevational views showing, partly in cross-section, the clean box 40 mounted on the load port 20 and the upper portion of a gas replacement unit 50 of the load port 20 and FIG. 3 is a top plan view showing the clean box 40.

The clean box body 41 is a container having a substantially square shape. A two stage flanged portion, i.e., a first flanged portion 41a and a second flanged portion 41b are provided around the periphery of the clean box body 41. A groove 46 is provided on that peripheral portion of the top surface of the lid 42 of the clean box 40 which confronts the first flanged portion 41a of the clean box body 41. The groove 46 is an annular groove 46 formed so as to surround the peripheral portion of the lid 42 confronting the first flanged portion 41a of the clean box 40. O-rings for sealing the annular groove is also mounted on the inside and outside of the annular groove 46 on the lid 42 so as to surround the peripheral portion of the lid also in annular shapes in a well known manner.

In the clean box 40 according to the present invention, this annular groove 46 is vacuum exhausted to thereby air-tightly seal the interface between the clean box body 41 and the lid 42 by the vacuum suction. Namely, the seal force may be insured by the differential pressure between the outside atmospheric pressure and the vacuum pressure within the annular groove 46. The vacuum exhaust of the annular groove 46 is performed through a vacuum port 57 (see FIG. 3) that is an intake/exhaust port provided on the side surface of the clean box body 41. The vacuum exhaust will be described later in detail.

Note that in the subject specification, for the sake of explanation, the terms, "vacuum exhaust", "vacuum suction" or simply "vacuum" are used but these terms, of course, do not mean a complete vacuum but a condition that the pressure is low relative to the atmospheric pressure.

Gas ports 55 and 56 for replacing the gas in the interior of the box by the non-oxidizing gas (nitrogen gas, inert gas or the like) are provided and juxtaposed at the same level on the side surface of the box body 41. One of them is a gas intake port 55 for introducing the gas and the other is an exhaust port 56 for discharging the gas.

The above-described clean box 40 may lay the article to be transferred such as a semiconductor wafer W or the like on the carrier 43 and transfer and store the article while sealing the non-oxidizing clean gas such as nitrogen in a sealed condition within the clean box by the suction of the annular groove 46.

In the case where the clean box 40 is set on the load port 20, the clean box 40 is positioned so that the lid 42 of the clean box 40 and the load port 20 are aligned with each other. The elevator 22 is a part of a mechanism 23 for opening/closing the lid of the clean box 40 and positioned at its top. The elevator 22 is a table that may ascend and descend together with the lid opening/closing mechanism 23. A mechanism (not shown) for effecting the vacuum suck of the lid 42 of the clean box 40 is provided on the top surface of the elevator 22. As will be described later, the lid 42 is opened downwardly, the carrier provided on the lid 42 is introduced into the load port 20 and the wafer laid on the carrier 43 is moved into the semiconductor processing device body. The transfer will be described later in more detail.

A seal groove 26 is provided at a position confronting the second flanged portion 41b of the clean box 40 located at a predetermined position on the top surface of the load port table 21. The seal groove 26 surrounds the elevator 22 in an annular shape. The O-rings 25 are mounted on both sides of the seal groove 26 for maintaining the seal property of the seal groove 26. The seal groove 26 is connected to a exhaust means (not shown). The seal groove 26 is vacuum exhausted to seal the interface between the load port table 21 and the clean box body 41 (second flanged portion 41b) when the clean box 40 is set on the load port table 22. The system including the interior of the clean box 40 and the interior of the semiconductor wafer processing 10 together is sealed against the outside by the seal with the seal groove 26, so that the system may be kept in the local clean space.

As described above, the vacuum port 57 for intake/exhaust of the annular groove 46 and the gas inlet port 55 and the gas exhaust port 56 for the gas replacement in the interior of the clean box are provided on the side surface of the clean box body 41. On the other hand, a gas unit 50 having a vacuum exhaust/release mechanism 53 (hereinafter referred to as a vacuum mechanism), a gas feed mechanism 51 and a gas discharge mechanism 52 in cooperation with each port of the clean box body 41 is provided on the table 21 (load port table).

The gas unit 50 is installed on a slider mechanism 29 provided on the load port table 21. The gas unit 50 is movable between a standby position (FIG. 2A) apart from the clean box 40 on the load port table 21 and an operative position in contact with each port 55, 56 and 57 of the clean box 40 by the slider mechanism 29.

When the gas unit 50 is located in the operative position, the vacuum port 57, the gas input port 55 and the gas output port 56 of the clean box 40 are in intimate contact with and aligned with the vacuum mechanism 53, the gas feed mechanism 51 and the gas discharge mechanism 52 of the gas unit 50, respectively.

The vacuum mechanism in cooperation with the vacuum port 57 and the vacuum port will now be described in more detail with reference to FIG. 4 that is an enlarged view of a primary portion of FIG. 2B.

Figure 4:
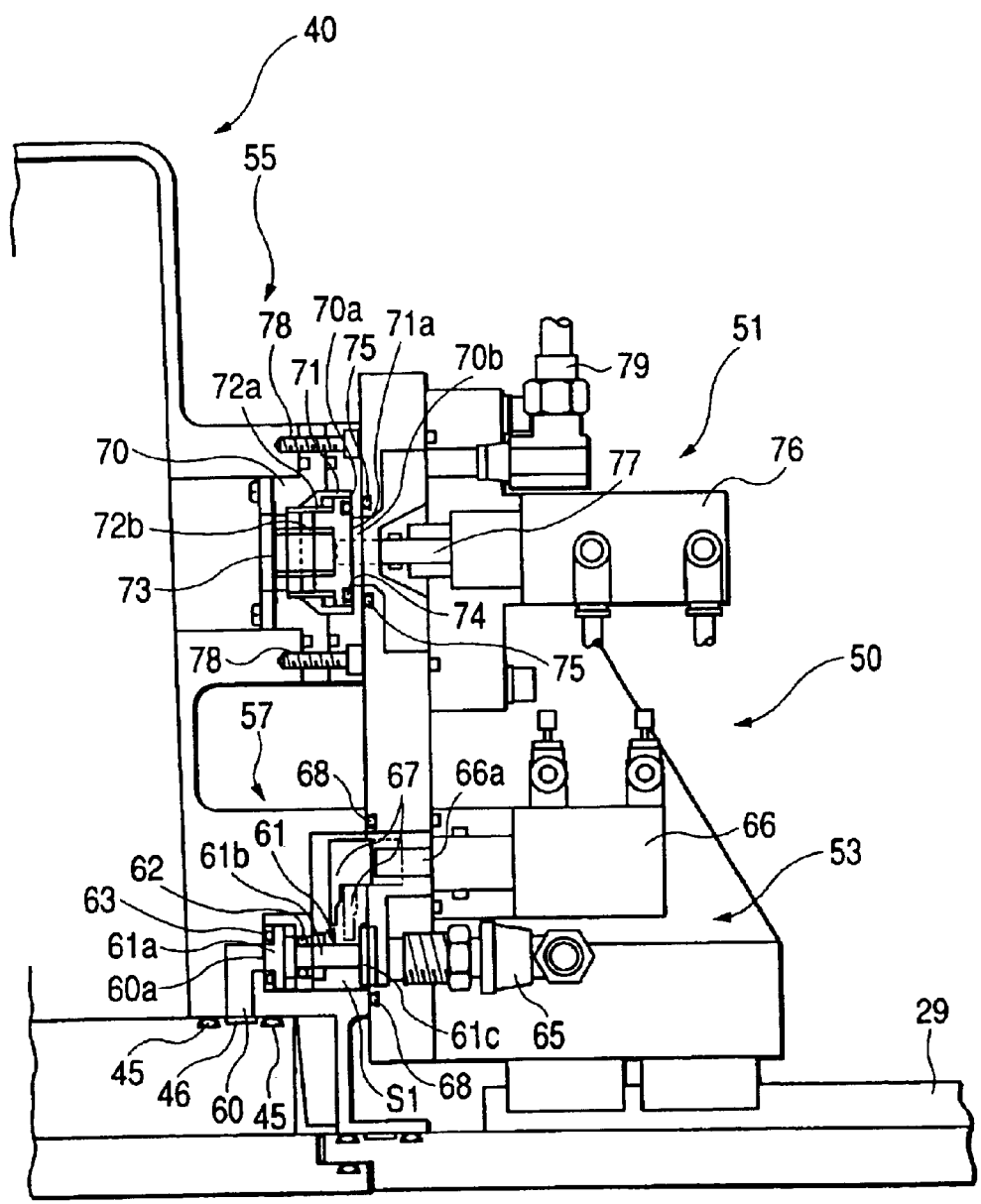

As shown in FIG. 4, the vacuum port 57 installed on the side surface of the clean box 42 includes a valve mechanism for performing the vacuum exhaust (or evacuation) of the annular groove 46. The valve mechanism includes a valve body 61 installed movable in the right and left directions of the drawing. The valve body 61 is composed of a closing flanged portion 61a for closing an end portion opening 60a of a passage 60 that is in communication with the annular groove 46, an engagement flanged portion 61c located on the opposite side thereof and a cylindrical shaft portion 61b for connecting both flanged portions to each other. A surface on the right side of the closing flanged portion 61a (on the opposite side to the surface confronting the passage 60) is biased in the left direction of FIG. 4 by a coiled spring 62. Namely, usually, the valve body 61 is pushed in a direction in which the valve body 61 closes the end portion opening 61a of the passage 60 to thereby air-tightly seal the passage 60 by the closing flanged portion 61a. In order to keep the seal property, an O-ring 63 is provided on the left surface of the closing flanged portion 61a so as to surround the opening 60a.

When the gas unit is moved to the operative position, the vacuum port 57 of the clean box 40 and the vacuum mechanism 53 of the gas unit 50 are in contact with and in alignment with each other. The interface between the vacuum port and the vacuum mechanism 53 is sealed by an O-ring 68.

The vacuum mechanism 53 of the gas unit 50 on the load port 20 has an actuator (air cylinder) 66 for releasing the closure of the passage 60 by the above-described valve body 61. A cylindrical portion 66a of the actuator 66 is movable linearly in the right and left directions of FIG. 4 and pivotal about an axis. A hook arm 67 is provided at an upper portion of the cylindrical portion 66a. When the clean box 40 is set on the load port table 21, the hook arm 67 is introduced into the vacuum port 57 of the lid 42 as indicated by a solid line in FIG. 4.

The hook arm 67 is pivotally and linearly moved by the actuator 66 so that the tip end of the hook arm 67 may be overlapped with the engagement flanged portion 61c of the valve body 61 as indicated by two dot and dash line in FIG. 4 in the direction of the axis. Under this condition, when the actuator 66 is operated in the straight line movement so that the hook arm 67 is moved in the right direction, the hook arm 67 is engaged with the engagement flange 61c, the valve body 61 as a whole is moved in the right direction against the expansion force of the spring 62. Thus, the closure of the end portion opening 60a of the passage 60 by the closing flange 61a is released so that the annular groove 46 is in communication with the space S1 through the passage 60. In this state, the annular groove 46 can be evacuated through a pipe 65 that is in communication with the space S1, or inversely, the gas can be introduced into the annular groove 46 that is kept under the vacuum condition to thereby release the vacuum.

The structure of the vacuum port 57 and the vacuum exhaust means has been described above. However, as a matter of fact, the clean box 40 is set on the load port 20 with the annular groove 46 and the passage 60 being evacuated. Therefore, the closing flange 61a of the valve body 61 is strongly pressed on the side of the passage 60 by the pressure difference between the inside and outside, i.e., the pressure difference between the space S1 and the space on the side of the passage 60. So, it is difficult to move the valve body 61 by the hook arm 67 to open the opening 60a.

Accordingly, in the case where the lid of the clean box 40 is to be opened, the following steps will be taken. First of all, the space S1 is evacuated through the passage 65 so that the pressure difference between the inside and outside of the closing flange 61a is obviated or suppressed. Thus, it is possible to release the closure of the passage 60 by the valve body 61 (closing flange 61a) by the hook arm 67 in accordance with the above-described sequence of the steps. After the closure of the passage 60 has been released, the passage 60 is released to the atmosphere or the air is introduced into the passage 60 so that the space S1, the passage 60 and the annular groove 46 becames equal to the atmospheric pressure. Thus, the vacuum suction seal between the lid 42 and the clean box body 41 is released to thereby make it possible to open the lid 42.

Inversely, a process for vacuum exhausting the annular groove 46 to suck the lid 42 and the clean box body 41 will be described as follows. First of all, under the condition that the closing flange 61*a* is opened, the passage 65 is connected to the vacuum source so that the annular groove 46 is evacuated through the space S1 and the passage 60. Subsequently, the actuator 66 is operated to release the engagement between the hook arm 67 and the engagement flange 61*c* in the opposite order of the steps to the above-described order. Thus, the valve body 61 is moved in the left direction by the force of the spring 62 to thereby close the opening 60*a* of the passage 60. Thereafter, the passage 65 is opened to the atmosphere. Thus, the side on the passage 60 is kept under the vacuum condition and the space S1 is kept at the atmospheric pressure so that the closing flange 61 firmly closes the passage 60 by the pressure difference between the inside and outside.

A mechanism for replacing the gas within the interior of the clean box 40 will now be described with reference to FIG. 4.

As described briefly before, the gas input port 55 and the gas output port 56 are arranged and juxtaposed on the side surface of the clean box body 41 for introducing and discharging the gas with respect to the clean box 40. The gas ports 55 and 56 and the related gas feed mechanism 51 and the gas discharge mechanism 52 on the load port will now be described in more detail. The gas input port 55 and the gas output port 56, and the gas feed mechanism 51 and the gas discharge mechanism 52 have the same structure, respectively. The difference is only the flow direction of the gas. Here the gas feed mechanism 51 and the gas input port 55 on the input side will be exemplified and explained.

As shown in FIG. 4, the gas input port 55 has a valve assembly 70 fixed to the clean box body 41 by screws 78. The valve body 71 is installed to be movable in the right and left directions of FIG. 4 within the valve assembly 70. The valve body 71 is biased in the right direction of FIG. 4 by two coiled springs 72*a* and 72*b* arranged around the valve body 71. Normally, under this biased condition, the peripheral portion of the end surface 71*a* of the valve body 71 is in contact with the inner surface 70*a* of the valve assembly to close the outer opening 70*b* of the valve assembly. An O-ring is provided in the peripheral portion of the end face 71*a* of the valve body for keeping seal property of this closure. A filter 73 is mounted on an opening on the side, of the clean box, of the valve assembly. Accordingly, the contamination substance is prevented from entering from the outside to the clean box.

Under the condition that the gas unit 50 is located in the operative condition, the gas input port 55 and the gas feed mechanism 51 are in alignment with and in contact with each other. The interface between the gas input port 55 and the gas feed mechanism 51 is sealed by the O-ring 75.

The gas feed mechanism 51 has an air cylinder 76 for opening the valve assembly 70 of the gas input port 55. The air cylinder 76 has a cylinder pin 77 that is movable in the right and left directions of FIG. 4 by a pneumatic pressure. The cylinder pin 77 is in alignment with the valve body 71 of the valve assembly 70.

In the case where non-oxidizing gas such as nitrogen gas is introduced into the clean box, the air cylinder is actuated, and the cylinder pin 77 is moved in the left direction to push the valve body 71 against the biasing force of the coiled springs 72*a* and 72*b* and to open the end portion opening 70*b* of the valve assembly 70. Then, the gas is fed through the passage 79 connected to the gas source.

The structure of the gas output port 56 and the gas discharge mechanism 52 on the gas output side is the same as the above-described gas input port 55 and gas feed mechanism 51 except that the gas is introduced through the passage 79 on the input side, whereas the gas is caused to flow out (discharged) on the output side. Accordingly, the explanation therefor will be omitted.

The valve assemblies of the gas input port and the gas output port are both simultaneously kept in the opened condition by the gas feed mechanism 51 and the gas discharge mechanism 52 and the non-oxidizing gas is fed from the passage 79 of the gas feed mechanism 51 so that the gas in the interior of the clean box 40 is purged and replaced by the non-oxidizing gas.

A mechanical latch is provided on the clean box lid 42 for preventing the lid 42 from falling apart from the clean box body 41. This mechanism prevents the lid 42 from falling apart in the case where the vacuum suction between the clean box body 41 and the lid 42 by the annular groove 46 fails due to some reason during the transfer of the clean box or the like. This latch mechanism will be explained with reference to FIG. 5.

This latch mechanism includes a circular rotary cam plate 101 disposed rotatably substantially about the center of the lid 42. Two cam grooves 101*a* and 101*b* are formed in the rotary cam plate. Also, the latch mechanism includes slide type latch members 103 and 104. The latch members 103 and 104 are slidable up and down in the drawing while being guided by guide members 106 and 107, respectively. Cam pins 105 and 106 are implanted on the latch members 103 and 104, respectively, and the cam pins 105 and 106 are engaged with cam grooves 101*a* and 101*b* of the rotary cam plate 101, respectively.

Figure 5:
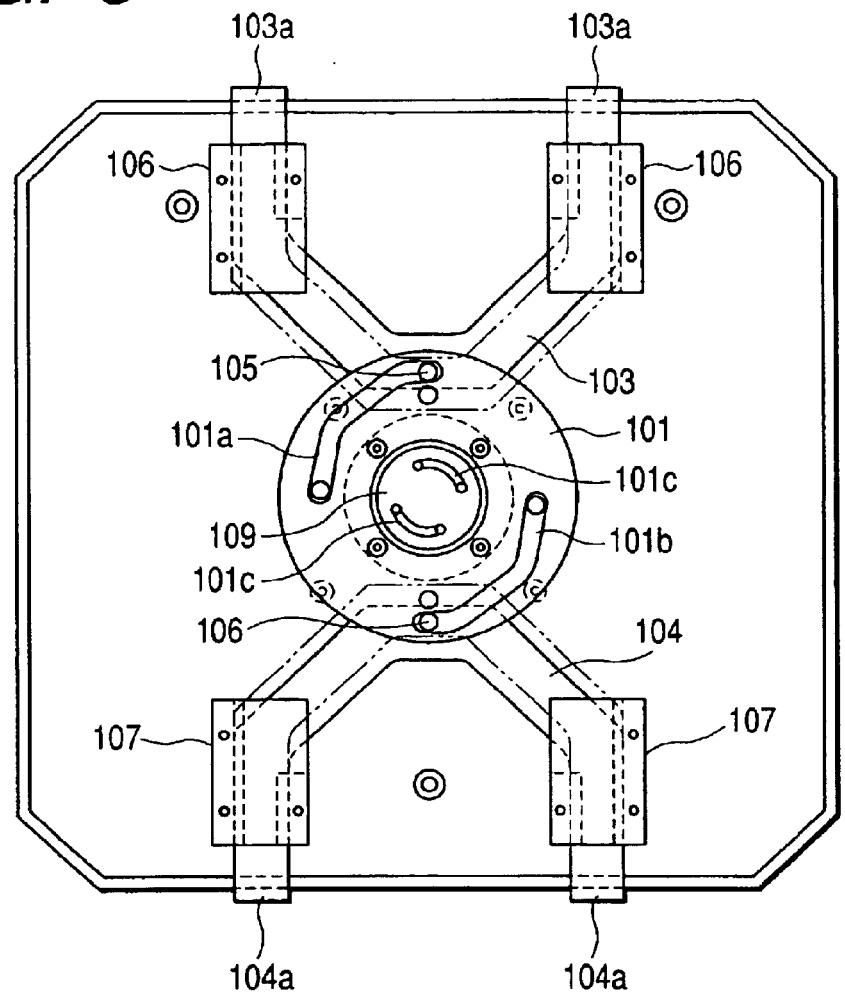

As shown in FIG. 5, the respective cam grooves 101*a* and 101*b* are formed so that a distance from the center of the rotary cam plate 101 changes in accordance with a circumferential position. In accordance with the cam shape, when the rotary cam plate 101 is fully rotated counterclockwise to be located in the position shown in FIG. 5, the respective latch members 103 and 104 are caused to slide on the outermost position so that the respective tip end portion 103*a* and 103*b* project from the periphery of the lid 42. In the case where the lid is mounted on the clean box body 41, the projected tip end portions 103*a* and 104*a* overlap with the inside of the tabs (not shown) provided on the clean box body 41 to latch the lid to the clean box body 42. Inversely, when the rotary cam plate 101 is fully rotated clockwise, the latch members 103 and 104 are caused to slide in the innermost position as indicated by the two-dot and dash line in the drawing. At this time, the tip ends 103*a* and 104*a* of the latch members are retracted from the periphery of the lid and are kept in the condition that they are not in cooperation with the tabs of the clean box.

Note that the latch mechanism is simply used for preventing the lid from falling apart in case of emergency. Namely, as a matter of fact, the lid 42 and the box body are firmly sucked to each other by the gas discharge of the annular groove 46 and the lid is not mainly retained by this latch mechanism. Accordingly, the cooperation between the latch members 103 and 104 and the tabs may be the non-contact cooperation. Namely, under the condition that the lid 42 is sucked, it is sufficient that the tip end portions 103*a* and 104*a* are overlapped with the tabs as viewed from below. If such a non-contact cooperation is taken, there is no frictional contact between the latch members 103 and 104 and the tabs when the latch mechanism is operated and no contaminative particle is generated, which is suitable for the mechanism.

A latch drive portion 109 for drivingly rotating the cam plate 101 is provided at the center of the rotary cam plate 101. Circumferential holes 101c are formed in the latch drive portion 109.

Figure 6:
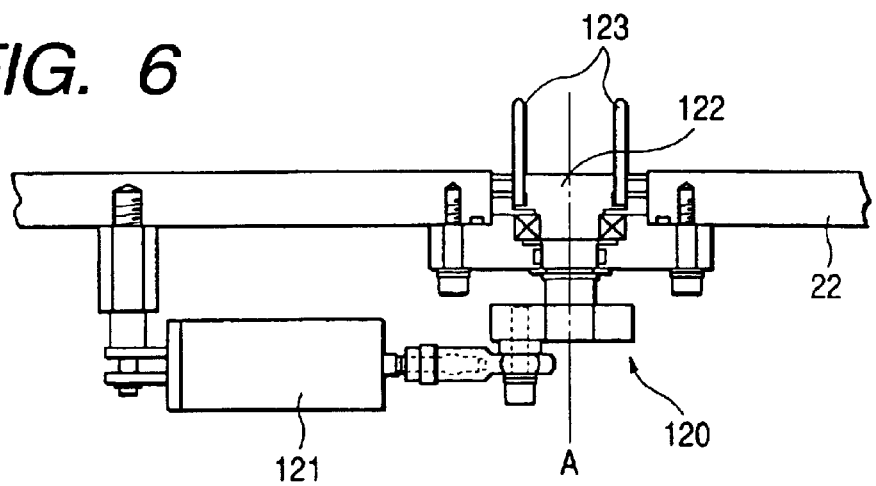

A latch opening/closing mechanism 120 is provided on the elevator 22 of the lid opening/closing mechanism 23 of the load port 20 in alignment with the above-described latch drive portion 109 when the clean box 40 is set at a predetermined position on the load port table 21. This is shown in FIG. 6. The latch opening/closing mechanism 120 has a rotary member 122 that is rotatable about an axis A and an air actuator 121 for drivingly rotating the rotary member 122 with an air pressure. Two pins 123 are caused to project from the upper portion of the rotary member. When the clean box 40 is set at the predetermined position, these pins 123 are engaged with the circumferential holes 101c of the latch drive portion 109. Under this condition, the air actuator is operated and the rotary member 122 is rotated to thereby rotate the rotary cam plate 101 through the latch drive portion to make it possible to engage and disengage the latch of the lid 42.

It will now be described how to perform the transfer of the semiconductor wafer and the delivery to the semiconductor wafer processing apparatus 10 by the clean box 40 in the clean transfer system in accordance with the present embodiment. Note that in the present embodiment, it is assumed that the lid of the clean box 40 that has been transferred is sucked and sealed to the clean box body by the vacuum exhaust of the annular groove 46 and the interior of the clean box is filled with the replacement gas having the non-oxidizing property, kept substantially at the atmospheric pressure.

The clean box 40 that has been transferred from another place by a man power or a transfer system such as an OHT or from another processing device is set on the load port 20 so that the positioning holes (not shown) formed in the lid 42 of the bottom of the clean box and the positioning pins (not shown) provided on the elevator of the load port are engaged with each other.

The following process is automatically performed in accordance with a computer control of the semiconductor wafer processing apparatus 10. The respective steps of the following process have been already described in detail.

When the clean box is set at in the predetermined position, the annular groove 26 in the top surface of the load port table 21 confronting the second flanged portion 41b of the clean box body 41 is evacuated by a suitable means (not shown) to thereby air-tightly sealed the clean box body 41 and the load port table. Thus, the system composed of the interior of the clean box 40 and the semiconductor wafer processing apparatus 10 is air-tightly sealed against the outside and to maintain this system as the clean space.

At the same time, the clean box lid 42 is sucked (through, e.g., vacuum suction) by the top surface of the elevator 22 of the load port by using a suitable means (not shown) so as to be clamped to the top surface of the elevator 22. Alternatively, the lid may be clamped by a mechanical means.

Subsequently, the mechanical latch of the clean box lid 42 is released by the latch opening/closing mechanism 120 of the clean box opening/closing mechanism 23.

Subsequently, the slider mechanism 29 of the load port is operated so that the gas unit 50 is moved to the operative position where it contacts with each port of the clean box.

Subsequently, the annular groove 46 of the clean box lid 42 is released to the atmospheric pressure in the order of the above-described steps or the gas is introduced thereinto by the vacuum mechanism 53 of the gas unit 50 to release the vacuum suction between the lid 42 and the clean box body 41.

The above-described two processes make it possible to remove the lid 42 away from the clean box body.

Then, the elevator 22 is lowered so that the lid 42 of the clean box that has been sucked to the elevator 22 is moved downwardly together with the wafer carrier 43 fixed to the lid. As a result, the lid 42 of the clean box 40 is opened and moved to the position shown in FIG. 1.

Here, a transfer robot 31 of the apparatus body 30 picks up the wafers W one by one from the carrier 43 through the opening 37 between the apparatus body 30 and the load port 20 with its swing arm 31b. The transfer robot can be descended or ascended by the elevator 31a. It is possible to pick up the wafers, in order, within the carrier 43 by changing the height.

In accordance with the vertical movement of the elevator 31a and the swing motion of the swing arm 31b, the transfer robot 31 causes the wafer W that has been picked up from the carrier to be laid on the stage 35 of the semiconductor wafer processing apparatus 10.

The wafer W that has been processed on the stage 35 by the semiconductor processing apparatus is returned and laid on the carrier 43 in the opposite order as that described above by the transfer robot 31.

When all the wafers within the carrier 43 or a desired number of wafers W have been processed, the elevator 22 of the load port 20 is raised up to a predetermined uppermost position, i.e., a predetermined position where the lid 42 again closes the clean box body 41.

The annular groove 46 of the lid 42 is vacuum exhausted by the vacuum mechanism 53 of the gas unit to thereby perform the air-tight seal between the lid 42 and the clean box body 41.

Subsequently, the latch drive portion 109 of the lid 42 is driven by the latch opening/closing mechanism 120 to make the latches 103 and 104 effective. Since the latch is effected after the sealing operation of the clean box, even if the particle is generated by the friction of the related mechanisms when the latch is effected, the particle is never introduced into the clean box.

Subsequently, the gas feed mechanism 51 and the gas discharge mechanism 52 of the gas unit are operated so that the interior of the clean box is displaced by the non-oxidizing gas such as nitrogen. Note that in the case where the interior of the semiconductor processing apparatus is kept under the non-oxidizing gas environment, this gas displacement process is not necessary.

Subsequently, the suction of the lid 42 by the elevator 22 and the vacuum suction between the load port table 21 and the second flanged portion 41b of the clean box are released. Thus, the clean box 40 may be moved to a next processing device or a reserving place.

In the above-described embodiment, the annular groove 46 for performing the air-tight seal between the clean box body 41 and the lid 42 is provided on the side of the lid 41. Of course, it is possible to provide this in the first flange 41a that is the surface confronting the lid on the side of the clean box body.

A second embodiment of the present invention will now be described.

Figure 7:
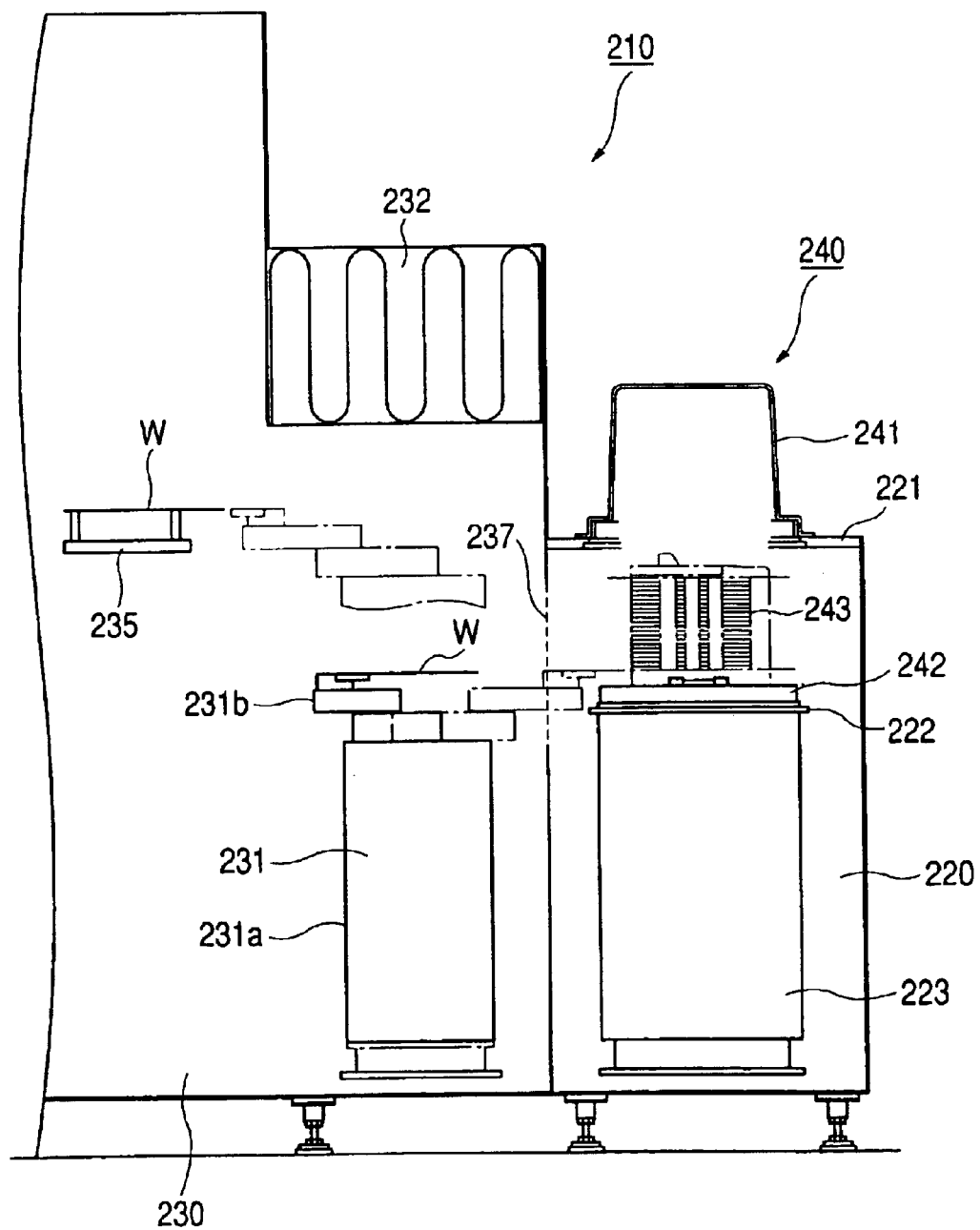
In FIGS. 7 to 14 showing a semiconductor processing apparatus according to a second embodiment of a clean system using a clean box according to the present invention.

FIG. 7 schematically shows a local clean space system of a semiconductor manufacture apparatus including a clean box in accordance with an embodiment of a clean system of the present invention.

In FIG. 7, the semiconductor wafer processing apparatus 210 is composed of an apparatus body 230 and a load port 220 for loading a semiconductor wafer within a clean box 240 into the processing device. An interface between the apparatus body 230 and the load port 220 is designated by a line A in FIG. 7. Usually, the load port 220 is formed as a discrete device that is detachably mounted on the apparatus body 230. However, the load port may be formed integrally with the apparatus body. The apparatus body 230 is in communication with the load port 220 through an opening 237 formed at a portion indicated by a dotted line on the line A of FIG. 7 for sending and receiving the semiconductor wafer between the load port and the apparatus body through the opening 237.

The space within the apparatus body 230 and the space of the load port 220 are in communication with each other through the above-described opening 237 so that the overall interior of the device 210 including both constitutes the local clean space. In order to keep the space clean, a fan intake blower device 232 having a filter is provided at an upper portion of the semiconductor wafer processing apparatus 210. A downstream air flow is generated within the apparatus by the fan intake blower device 232 to thereby keep the space within the semiconductor wafer processing apparatus 210 clean. The downstream air flow is discharged from the bottom of the apparatus to the outside.

In FIG. 7, the clean box 240 in accordance with the present invention is set on a table 221 of a top surface of the load port 220. The clean box 240 is a sealed type container composed of a box-shaped clean box body 241 that opens at its bottom and a lid 242 for covering the opening of the bottom of the body. As will be described in more detail later, when the clean box 240 is laid on the table 221 of the load port 220 and the wafer W within the clean box 240 is entered and removed, the interface between the clean box body 241 and the table 221 is sealed by a vacuum suction using the annular groove (indicated by reference numeral 226 in FIG. 8) formed on the table 221 to thereby maintain the clean space against the outside.

The clean box 240 is a container to be used for transfer of wafer among different devices and temporary deposit of the wafer. The clean box 240 has a carrier 243 fixed to the lid 242. The carrier 243 is a rack type structure for receiving a plurality of wafers in parallel and at an equal interval.

The load port 220 has an elevator type clean box opening/closing mechanism 223 for opening/closing the lid 242 of the clean box 240 and moving the lid 242 downwardly together with carrier 243 to make it possible to pick up the wafers within the carrier. As will be described in more detail later, the clean box opening/closing mechanism 223 has also a mechanism for replacing the interior within the clean box by the gas. The clean box 240 is transferred by a transfer means such as an overhead transfer (OHT) system within the factory and is set on the table 221 of the load port 220. In some cases, the transfer of the clean box may be manually performed directly by the operator.

Figure 8:
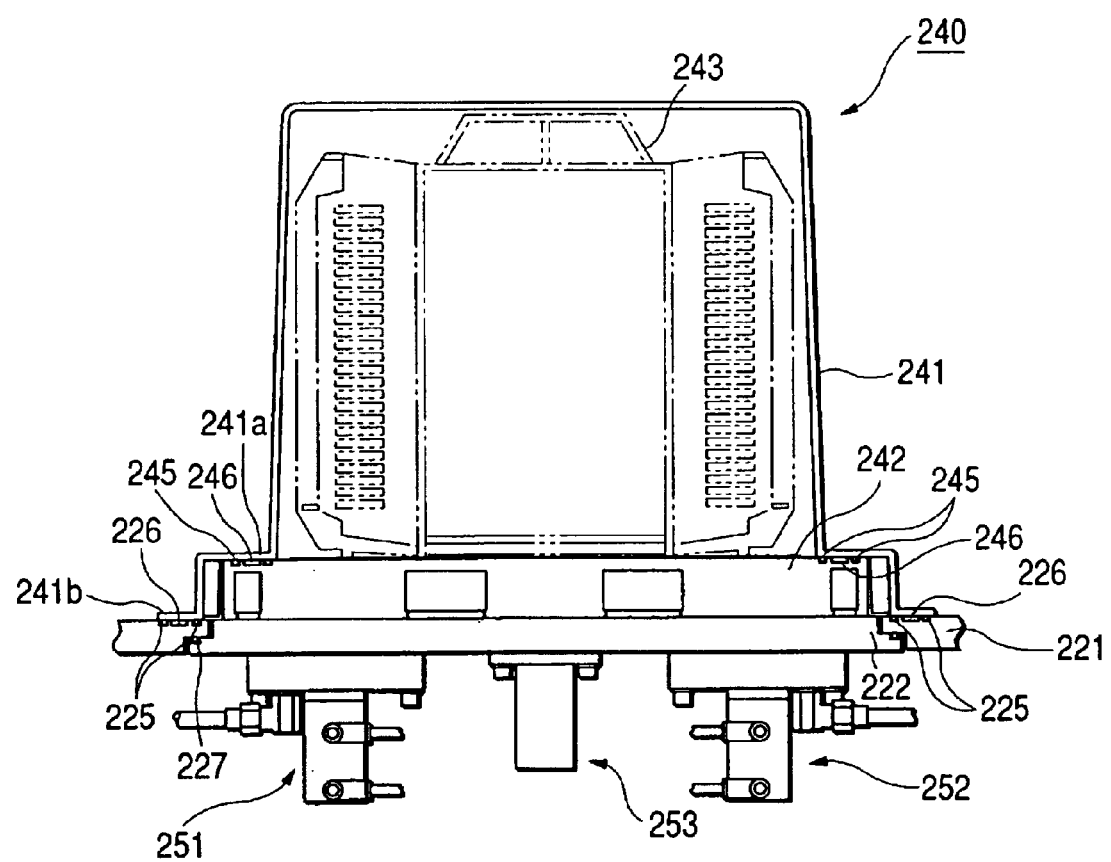
Figure 9:
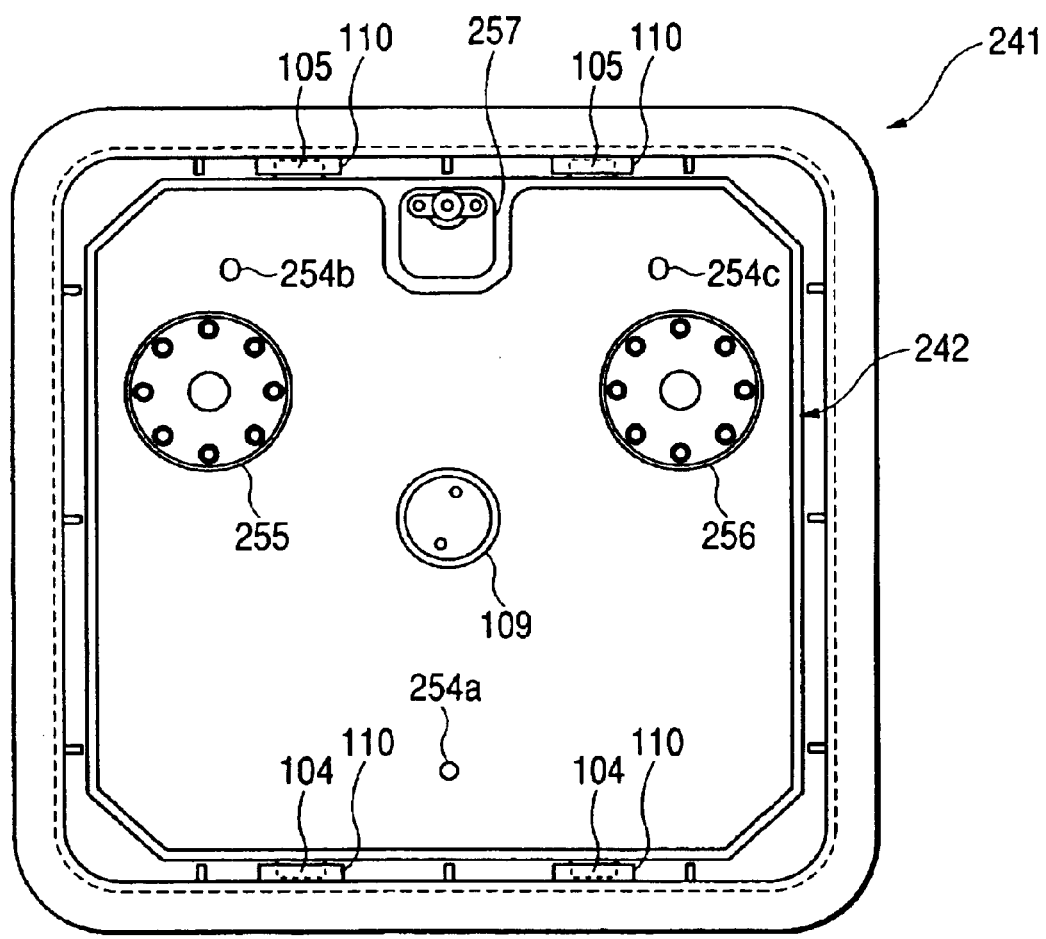

The clean box 240 will now be described in more detail with reference to FIGS. 8 and 9. FIG. 8 is a side elevational view showing, partly in cross-section, the clean box 240 mounted on the load port 220 and a top portion of the clean box opening/closing mechanism 223 of the load port, and FIG. 9 is a view showing a bottom surface of the clean box 240.

The clean box body 241 is a container having a substantially square shape. A two stage flanged portion, i.e., a first flanged portion 241a and a second flanged portion 241b are provided around the periphery of the clean box body 241. A groove 246 is provided on that peripheral portion of the top surface of the clean box 40 which confronts the first flanged portion 241a of the clean box body 241. The groove 246 is an annular groove 246 formed so as to surround the peripheral portion of the lid 242 confronting the first flanged portion 241a of the clean box 240. O-rings for sealing the annular groove 246 are also mounted on the inside and outside of the annular groove 246 on the lid 242 so as to surround the peripheral portion of the lid also in annular shapes in a well known manner.

In the clean box 240 according to the present invention, this annular groove 246 is vacuum exhausted to thereby air-tightly seal the interface between the clean box body 241 and the lid 242 by the vacuum suction. Namely, the seal force may be insured by the differential pressure between the outside atmospheric pressure and the vacuum pressure within the annular groove 246. The vacuum exhaust of the annular groove 246 is performed through a vacuum port 257 (see FIG. 10) that is an intake/exhaust port provided on the bottom surface (i.e., outer surface) of the lid 242. The vacuum exhaust will be described later in detail.

Gas ports 255 and 256 are provided at the lid 242 for replacing the gas in the interior of the box by the non-oxidizing gas (nitrogen gas, inert gas or the like). One of them is a gas input port 255 for introducing the gas and the other is an output port 256 for discharging the gas. The lid 242 further includes mechanical latches 103 and 104 for preventing the lid from falling apart from the box body in cooperation with the tabs 110 of the clean box body 241 and the latch drive portion 109 for driving the latches. The various mechanisms related to the mechanical latches are the same as those described in conjunction with the first embodiment.

The above-described clean box 240 may keep the article to be transferred such as a semiconductor wafer W or the like on the carrier 243 and transfer and store the article while sealing the non-oxidizing clean gas such as nitrogen in a sealed condition within the clean box by the suction of the annular groove 246.

The relationship between the clean box 240 and the load port 220 will now be described. In the case where the article to be transferred such as a semiconductor wafer to be transferred by the clean box is to be loaded on the semiconductor wafer processing apparatus, as shown in FIG. 8, the clean box 240 is set on the table 221 of the load port 220. Positioning holes 254a, 254b and 254c of the clean box bottom (see FIG. 9) are engaged with positioning pins (not shown) provided on the top surface of the elevator 222 of the upper portion of the clean box opening/closing mechanism of the load port so that the lid 242 of the clean box and the elevator 222 of the load port are positioned in alignment with each other. The elevator 222 is mounted on the uppermost surface of the elevator type clean box opening/closing mechanism 223 and may be movable up and down together with the clean box opening/closing mechanism 223 by a mechanism not shown.

An annular groove 226 surrounding the periphery of the elevator 222 and two annular O-rings 225 for sealing the annular groove 226 are provided at a position confronting with the second flanged portion 241b of the clean box body 241 on the top surface of the load port table 221 under the thus positioned condition. The groove 226 is evacuated to thereby air-tightly seal the interface between the clean box body 241 and the load port table 221. An O-ring 227 is provided also to the elevator 222 for sealing the interface between the elevator 222 and the table 221. This is done for the purpose of sealing the inner clean space of the semiconductor wafer processing apparatus 210 against the outer space when the clean box is not used.

A vacuum exhaust/release mechanism (hereinafter referred to as a vacuum mechanism) 253 is laid in a position in alignment with the vacuum port 257 of the lid 242 under the above-described positioned condition on the elevator 222 of the clean box opening/closing mechanism 223. In the same manner, a gas feed mechanism 251 and a gas discharge mechanism 252 are provided at a position in alignment with a gas input port 255 and at a position in alignment with a gas output port 256, respectively.

Figure 10:
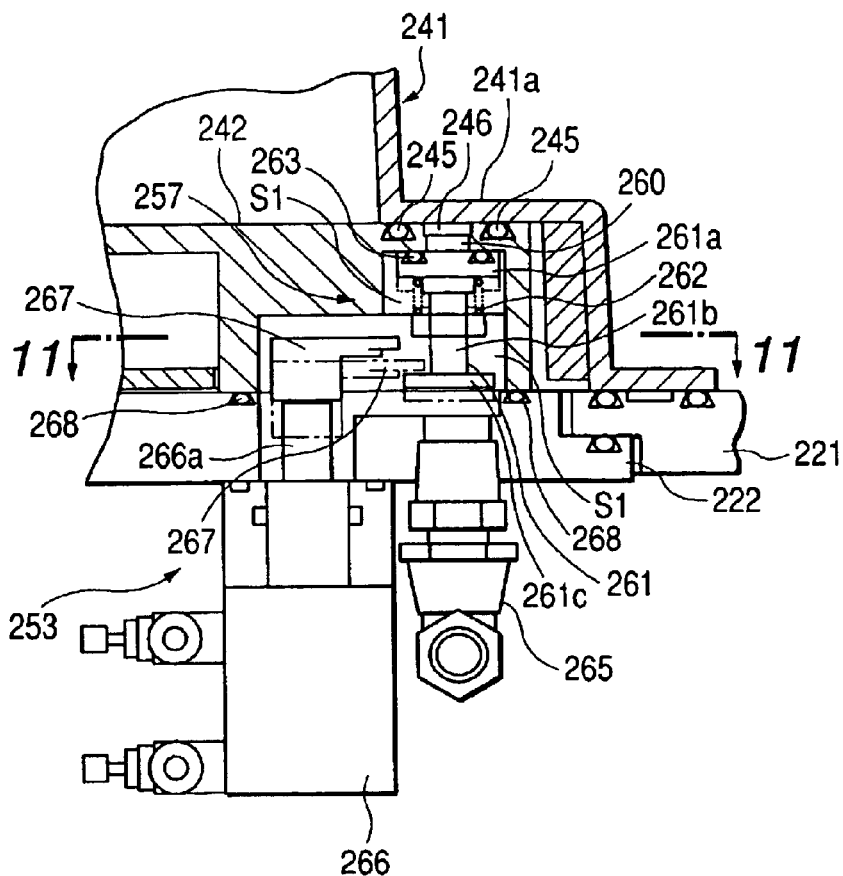

The vacuum port 257 provided in the lid 242 will now be described with reference to FIG. 10. FIG. 10 is a side elevational view showing, partly in cross section, a vacuum port portion 257 of the lid and a vacuum mechanism 253 on the side of the clean box opening/closing mechanism 223 of the load port related to the vacuum port portion. As shown in FIG. 10, a valve mechanism is provided in the interior of the lid 242 for performing the vacuum exhaust of the annular groove 246. The valve mechanism includes a valve body 261 installed movable up and down. The valve body 261 is composed of a closing flanged portion 261a for closing a passage 260 in communication with the annular groove 246, an engagement flanged portion 261c opposite to the closing flanged portion 261a and a cylindrical shaft portion 261b for connecting the two portions with each other. A bottom surface of the closing flanged portion 261a (a surface opposite to the surface confronting the passage 260) is biased upwardly by a coiled spring 262. Namely, the valve body 261 is normally pressed in a direction to close the passage 260. The passage 260 is air-tightly sealed by the closing flanged portion 261a. In order to keep the air-tight state, an O-ring 263 is provided on the top surface of the closing flanged portion 261a.

The vacuum mechanism 253 of the clean box opening/closing mechanism 223 on the side of the load port 220 has an actuator (air cylinder) 266 for releasing the closure of the passage 260 by the above-described valve body 261. A cylindrical portion 266a of the actuator 266 may be pivotally moved about the shaft and linearly moved up and down by the air pressure. A hook arm 267 is provided at an upper portion of the cylindrical portion 266a. When the clean box 240 is laid on the load port table 221, the hook arm 267 is introduced into the vacuum port 257 of the lid 242 as indicated by the solid line in FIG. 10. Under this condition, the position of the hook arm is also shown by the solid line in FIG. 11 which is a perspective view as viewed from the line V—V of FIG. 10.

Figure 11:
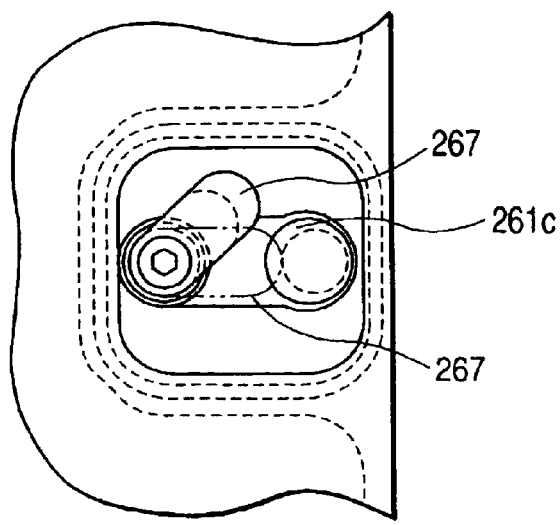

The actuator 266 is operated to pivotally move the hook arm 267 to the position depicted by the two-dot and dash line in FIGS. 10 and 11 so that the end of the hook arm and the engagement flanged portion 261c of the valve body 261 are overlapped with each other in the axial direction. Under this condition, when the actuator 266 is operated in the linear direction and the hook arm 267 is drawn downwardly, the hook arm 267 is engaged with the engagement flange 261c and the valve body 261 as a whole is drawn downwardly against the expansion force of the spring 262. Thus, the closure of the passage 260 by the closing flange 261a is released so that the annular groove 246 is in communication with the space S1 through the passage 260. Thus, it is possible to evacuate the annular groove 246 by the passage 265 in communication with the space S1 and inversely release the vacuum by introducing the gas into the annular groove 246 which has been evacuated.

Note that the O-ring 268 is disposed to surround the vacuum mechanism 253 on the top surface of the elevator 222 and imparts the seal with the lid 242.

The structure of the vacuum port 257 and the vacuum discharge means has been described above. As a matter of fact, the lid 242 of the clean box is disposed on the load port under the condition that the annular groove 246 and the passage 260 are evacuated. Accordingly, the closing flange 261a of the valve body 261 is strongly pushed against the passage 260 by the pressure difference between inside and outside, i.e., the pressure difference between the space on the side of the passage 260 and the space S1. So, it is difficult to draw the valve body 261 downwardly by the hook arm 267.

Accordingly, in the case where the lid 242 of the clean box 240 is opened, the following process will be followed. First of all, the pressure difference between the inside and outside of the closing flange 261a is obviated or suppressed by evacuating the space S1 through the passage 265. Thus, it is possible to release the closure of the passage 260 by the valve body 261 (closing flange 261a) by the hook arm in the order of the above-described steps. After the closure of the passage has been released, the passage 260 is released to the atmospheric pressure or the gas is introduced thereinto through the passage 265 so that the pressure in the space S1, the passage 260 and the annular groove 246 becomes equal to the atmospheric pressure. Thus, the vacuum suction seal between the lid 242 and the clean box body 241 is released to make it possible to open the lid 242.

Inversely, the process for sucking the lid 242 and the clean box body 241 by evacuating the annular groove 246 is as follows. First of all, under the condition that the closing flange 261a is open, the passage 265 is connected to the vacuum source and the annular groove 246 is vacuum exhausted through the space S1 and the passage 260. Subsequently, the actuator 266 is operated so that the engagement between the hook arm and the engagement flange 261c is released in the order of the steps opposite to those described above. Thus, the valve body 261 is moved upwardly by the force of the spring 262 so that the closing flange 261a closes the passage 260. Thereafter, the passage 265 is released to the atmosphere. Thus, the side of the passage 260 is kept under the vacuum pressure and the space S1 is kept under the atmospheric pressure so that the closure flange 261 firmly closes the passage 260 by the pressure difference between the inside and outside.

A mechanism for replacing the gas in the clean box 240 will now be described. As described before, the gas input port 255 and the gas output port 256 are further arranged in the lid 242 for introducing and discharging the gas with respect to the clean box 240. The gas ports 255 and 256 and the related gas feed mechanism 251 and the gas discharge mechanism 252 on the load port will now be described in more detail. The gas input port 255 and the gas output port 256, and the gas feed mechanism 251 and the gas discharge mechanism 252 have the same structure, respectively. The difference is only the flow direction of the gas. Here the gas feed mechanism 251 and the gas input port 255 on the input side will be exemplified and explained.

Figure 12:
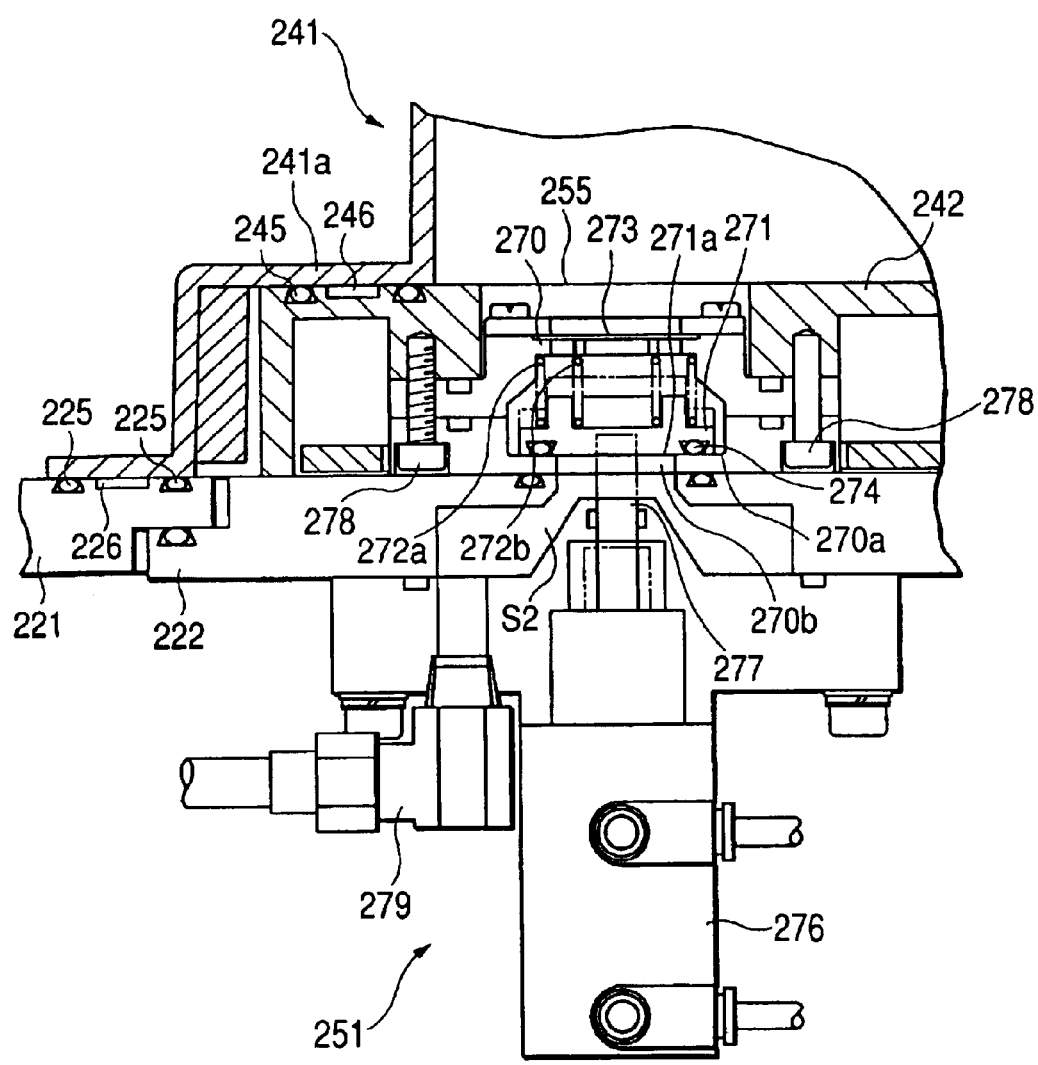

FIG. 12 is a side elevational view showing, partly in cross-section, the gas input port 255 of the lid and the related gas feed mechanism 251 of the clean box opening/closing mechanism 223 of the load port. The gas input port has a valve assembly 270 fixed to the lid 242 by screws 278. A valve body 271 is installed to be movable up and down within the valve assembly 270. The valve body 271 is biased downwardly by two coiled springs 272a and 272b arranged around the valve body 271. Normally, under this biased condition, the peripheral portion of the bottom surface 271a of the valve body 271 is in contact with the inner surface 270a of the valve assembly to close the lower opening 270b of the valve assembly. An O-ring 274 is provided in the peripheral portion of the lower surface 271a of the valve body for keeping seal property of this closure. A filter 273 is mounted on an opening on the upper side of the valve assembly. Accordingly, the contamination substance is prevented from entering from the outside to the clean box.

Under the condition that the clean box 240 is laid on the load port table 221, the gas input port 255 and the gas feed mechanism 251 are in face alignment with each other. The gas feed mechanism 251 has an air cylinder 276 for opening the valve assembly 270 of the gas input port 255. The air cylinder 276 has a cylinder pin 277 that is movable up and down by a pneumatic pressure. The cylinder pin 277 is in alignment with the valve body 271 of the valve assembly 270.

In the case where non-oxidizing gas such as nitrogen gas is introduced into the clean box, the air cylinder is actuated, and the cylinder pin 277 is moved upwards to push the valve body 271 against the biasing force of the coiled springs 272a and 272b and to open the lower portion opening 270b of the valve assembly 270. Then, the gas is fed through the passage 279 connected to the gas source and the space S2.

The structures of the gas output port 256 and the gas discharge mechanism 252 are the same as the above-described structures of the gas input port 255 and the gas feed mechanism 251 except that the gas is introduced through the passage 279 on the input side, whereas the gas is caused to flow out (discharged) on the output side. Accordingly, the explanation thereof will be omitted.

The valve assemblies of the gas input port and the gas output port are both simultaneously kept in the opened condition by the gas feed mechanism 251 and the gas discharge mechanism 252 and the non-oxidizing gas is fed from the passage 279 of the gas feed mechanism 251 so that the gas in the interior of the clean box 240 is purged and replaced by the non-oxidizing gas.

Figure 13:
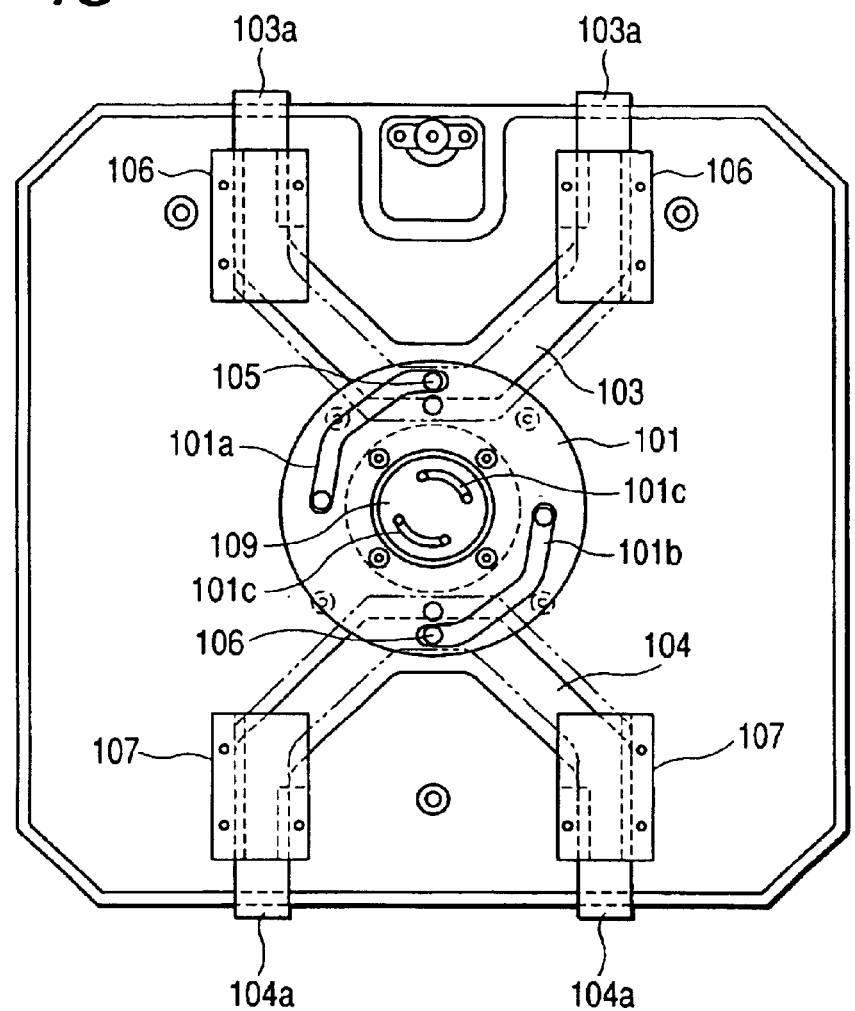
Figure 14:
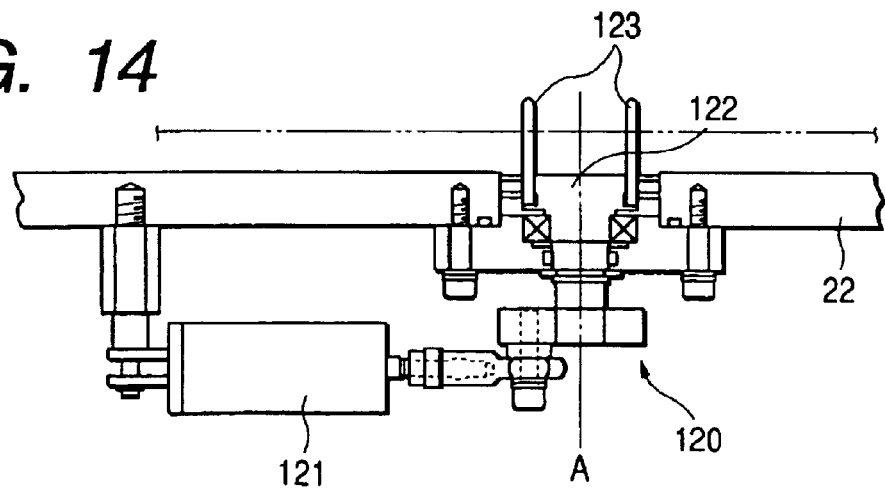

A mechanical latch is provided on the clean box lid 242 for preventing the lid 242 from falling apart from the clean box body 241. This mechanism prevents the lid 242 from falling apart in the case where the vacuum suction between the clean box body 241 and the lid 242 by the annular groove 246 fails due to some reason during the transfer of the clean box or the like. The latch mechanism is shown in FIG. 13 and the latch opening/closing mechanism provided on the load port for opening/closing the latch mechanism is shown in FIG. 14. Since the latch mechanism and the latch opening/closing mechanism are the same as those of the first embodiment, the same reference numerals are used to indicate the like components and the explanation will be omitted.

It will now be described how to perform the transfer of the semiconductor wafer and the delivery to the semiconductor wafer processing apparatus 210 by the clean box 240 in the clean transfer system in accordance with the present embodiment. Note that in the present embodiment, it is assumed that the lid of the clean box 240 that has been transferred is sucked and sealed air tightly to the clean box body by the vacuum exhaust of the annular groove 246 and the interior of the clean box is filled with the replacement gas having the non-oxidizing property, kept substantially at the atmospheric pressure.

The clean box 240 that has been transferred from another place by a man power or a transfer system such as an OHT or from another processing device is laid on the load port 220 so that the positioning holes 254a, 254b and 254c formed in the lid 242 of the bottom of the clean box and the positioning pins provided on the elevator of the load port are engaged with each other.

The following process is automatically performed in accordance with the computer control of the semiconductor wafer processing apparatus 210. The detail of the following process has been already explained.

When the clean box is set at the predetermined position, the annular groove 226 in the top surface of the load port table 221 confronting the second flanged portion 241b of the clean box body 241 is evacuated by a suitable means (not shown) to thereby air-tightly seal the clean box body 241 and the load port table. Thus, the system composed of the interior of the clean box 240 and the semiconductor wafer processing apparatus 210 is air-tightly sealed against the outside and to maintain this system as the clean space.

At the same time, the clean box lid 242 is sucked (through, e.g., vacuum suction) by the top surface of the elevator 222 of the load port by using a suitable means (not shown) so as to be clamped to the top surface of the elevator 222. Alternatively, the lid may be clamped by a mechanical means.

Subsequently, the mechanical latch of the clean box lid 242 is released by the latch opening/closing mechanism 120 of the clean box opening/closing mechanism 223.

Subsequently, the annular groove 246 of the clean box lid 242 is released to the atmospheric pressure in the order of the above-described steps or the gas is introduced thereinto by the vacuum mechanism 253 of the clean box opening/closing mechanism 223 to release the vacuum suction between the lid 242 and the clean box body 241.

The above-described two processes make it possible to remove the lid 242 away from the clean box body.

Then, the elevator 222 is lowered so that the lid 242 of the clean box that has been sucked to the elevator 222 is moved downwardly to the position shown in FIG. 7 together with the wafer carrier 243 that has been fixed to the lid. As a result, the lid 242 of the clean box 240 is opened and moved to the position shown in FIG. 7.

Here, a transfer robot 231 of the apparatus body 230 picks up the wafers W one by one from the carrier 243 through the opening 237 between the apparatus body 230 and the load port 220 by its swing arm 231b. The transfer robot may be descended or ascended by the elevator 231a. It is possible to pick up the wafers, in order, within the carrier 243 by changing the height.

In accordance with the vertical movement of the elevator 231a and the swing motion of the swing arm 231b, the transfer robot 231 causes the wafer W that has been picked up from the carrier to be laid on the stage 235 of the semiconductor wafer processing apparatus 210.

The wafer W that has been processed on the stage 235 by the semiconductor processing apparatus is returned and laid on the carrier 243 in the opposite order to that described above by the transfer robot 231.

When all the wafers within the carrier 243 or a desired number of wafers W have been processed, the elevator 222 of the load port 220 is raised up to a predetermined uppermost position, i.e., a predetermined position where the lid 242 again closes the clean box body 241.

The annular groove 246 of the lid 242 is vacuum exhausted by the vacuum mechanism 253 of the load port to thereby perform the air-tight seal between the lid 242 and the clean box body 241.

Subsequently, the latch drive portion 109 of the lid 242 is driven by the latch opening/closing mechanism 120 to make the latches 103 and 104 of the lid effective. Since the latch is effected after the sealing operation of the clean box, even if the particle is generated by the friction of the related mechanisms when the latch is effected, the particle is never introduced into the clean box.

Subsequently, the gas feed mechanism 251 and the gas discharge mechanism 252 of the load port are operated so that the interior of the clean box is displaced by the non-oxidizing gas such as nitrogen. Note that in the case where the interior of the semiconductor processing apparatus is kept under the non-oxidizing gas atmosphere, this gas displacement process is not necessary.

Subsequently, the suction of the lid 242 by the elevator 222 and the vacuum suction between the load port table 221 and the second flanged portion 241b of the clean box are released. Thus, the clean box 240 may be moved to a next processing device or a reserving place.

In the above-described embodiment, the annular groove 246 for performing the air-tight seal between the clean box body 241 and the lid 242 is provided on the side of the lid 241. Of course, it is possible to provide this in the first flange 241a that is the surface confronting the lid on the side of the clean box body. In this case, it is sufficient that the passage 260 in communication with the annular groove on the side of the clean box body under the condition that the lid is mounted on the clean box is provided on the lid side.

In the above-described clean box in accordance with the first embodiment and the second embodiment, it is possible to obtain a seal force that is several tens of times greater than the mechanical lock by the vacuum suction of the lid. The present inventors conducted experiments by using the clean box in accordance with the present invention. It was found that the oxygen concentration might be kept at 1,000 ppm in 168 hrs with the clean box whose interior was replaced by the nitrogen gas. Thus, it was possible to completely suppress the increase of the oxidized film on the wafer.

Also, it was found that the entrainment of the particle might be effectively suppressed.

The clean box and the clean transfer method according to the present invention in conjunction of the semiconductor wafer processing apparatus in the semiconductor manufacturing process has been described above. However, the present invention is not limited thereto or thereby but may be applied to other transfer of various kinds of articles to be transferred in the clean environment.

With the clean box according to the present invention, the annular groove is formed to surround the box opening on one of the lid member and the box body and the sealed space defined between the box body and the lid member is evacuated to perform the vacuum suction so that the seal force that is several tens of times greater than that of the conventional mechanical lock may be obtained. In the case where the interior of the clean box is replaced by the non-oxidizing gas, there is no gas leakage and it is possible to obtain an effective seal for a long period of time. It is also possible to effectively prevent the particle from entering.

Also, since the intake/exhaust port for the annular groove for suction is provided at the lid member according to the second aspect of the present invention, in the case where the lid member of the clean box is to be opened and closed by the load port of the clean device, it is sufficient to access the clean device only in one direction, i.e., in the direction toward the lid. This is convenient for constituting the system. Also, in the case where the clean box is to be located on the load port, it is sufficient to perform only the positioning for the one surface of the clean box. Therefore, this is very simple and convenient.

Furthermore, with the clean box according to one embodiment of the present invention, the valve means for allowing the gas to be introduced or discharged for replacement of gas in the interior of the clean box is provided on the lid member. Also, the valve means is provided on the lid member so that the access to the valve may be performed from the load port side only on the lid side. It is sufficient that the positioning and alignment of the clean box is performed only on one surface in the same manner as described above.

Also, with the clean box according to the present invention, since the intake/exhaust port or the valve means are provided on the side of the lid member, the structure on the side of the box body is simplified. Namely, the side of the box body may be formed integrally so that the box is hardly damaged.

What is claimed is:

1. A clean transfer method using a clean box comprising: a box body having an opening in a bottom; a lid member for closing said opening; an annular groove formed so as to surround said opening on at least one of said box body and said lid member to define a suction space sealed between said lid member and said box body when said lid member is mounted on said box body; and an intake/exhaust port for allowing vacuum exhaust/release of said annular groove from the outside the clean box, comprising the steps of:

disposing the clean box, sucked by vacuum discharging said annular groove, on a load port of a clean device whose interior is kept under a clean environment and having a box lid opening/closing mechanism for opening/closing the lid member of the clean box, so that said lid member and the box lid opening/closing mechanism on the side of the load port are aligned to confront with each other with said lid member facing downward;

releasing vacuum in the suction space through said intake/exhaust port by a mechanism for releasing the vacuum provided on the load port to thereby open said lid member; and picking up an article to be transferred within the clean box and moving the article to the clean device.

2. A clean transfer method according to claim 1, further comprising the steps of:

closing said lid member of the clean box by said box lid opening/closing mechanism after the article to be transferred that has been subjected to a process in the clean device has been returned back to the clean box; and evacuating the suction space through a gas exhaust mechanism provided on the load port to suck together said lid member and said box body.

3. A clean transfer method according to claim 2, wherein said clean box has a valve for allowing gas in the interior of said box to be replaced, the method further comprising the steps of returning back to the clean box the article to be transferred that has been subjected to the process in the clean device, closing the lid member of the clean box, and performing the replacement of gas in the space of the interior of the clean box through the valve after the suction space is evacuated through said gas exhaust mechanism so that the lid member and the box body are sucked together.

4. A clean transfer method according to claim 2, wherein said clean box has a mechanical latch for preventing the lid member from falling apart from the box body, and said box lid opening/closing mechanism releases the mechanical latch before the release of vacuum of the suction space.

5. A clean transfer method according to claim 4, wherein the mechanical latch is effected after the suction space has been evacuated so that the lid member and the box body have been sucked together, after the article to be transferred that has been subjected to the process in the clean device has been returned back to the clean box.

6. A clean transfer method using a clean box comprising: a box body having an opening in a bottom; a lid member for closing said opening; an annular groove formed so as to surround said opening on at least one of said box body and said lid member to define a suction space sealed between said lid member and said box body when said lid member is mounted on said box body; and an intake/exhaust port formed on the lid member for allowing vacuum exhaust/ release of said annular groove from the outside of the clean box, comprising the steps of:

disposing the clean box, sucked by vacuum discharging said annular groove, on a load port of a clean device whose interior is kept under a clean environment and having a box lid opening/closing mechanism for opening/closing the lid member of the clean box, so that said lid member and the box lid opening/closing mechanism on the side of the load port are aligned to confront with each other;

releasing vacuum in the suction space by a box lid opening/closing mechanism on the load port through said intake/exhaust port provided on the lid member of the clean box to thereby open said lid member; and picking up an article to be transferred within the clean box and moving the article to the clean device.

7. A clean transfer method according to claim 6, further comprising the steps of:

closing said lid member of the clean box by said box lid opening/closing mechanism after the article to be transferred that has been subjected to a process in the clean device has been returned back to the clean box; and evacuating the suction space through said intake/exhaust port to suck together said lid member and said box body.

8. A clean transfer method according to claim 7, wherein said clean box has a valve for allowing gas in the interior of said box to be replaced, the method further comprising the steps of:

returning back to the clean box the article to be transferred that has been subjected to the process in the clean device;

closing the lid member of the clean box; and performing the replacement of gas in the interior of the clean box through the valve after the suction space is evacuated through said intake/exhaust port so that the lid member and the box body are sucked together.

9. A clean transfer method according to claim 7, wherein said clean box has a mechanical latch for preventing the lid member from falling apart from the box body, said box lid opening/closing mechanism releases the mechanical latch before the release of vacuum of the suction space.

10. A clean transfer method according to claim 9, wherein the mechanical latch is effected after the suction space has been discharged and the lid member and the box body have been sucked together, after the article to be transferred that has been subjected to the process in the clean device has been returned back to the clean box.

* * * * *